(12) United States Patent
Lee et al.

(10) Patent No.: US 9,570,481 B2
(45) Date of Patent: Feb. 14, 2017

(54) DISPLAY SUBSTRATE AND METHOD OF MANUFACTURING THE SAME

(71) Applicant: Samsung Display Co., LTD., Yongin, Gyeonggi-Do (KR)

(72) Inventors: Hong-Beom Lee, Hwaseong-si (KR);
Sang-Hyun Kang, Yongin-si (KR);
Soo-Chul Kim, Gwangmyeong-si (KR);
Hong-Joon Moon, Cheonan-si (KR);
Jun-Seok Lee, Cheonan-si (KR)

(73) Assignee: Samsung Display Co., Ltd. (KR)

( * ) Notice: Subject to any disclaimer, the term of this patent is extended or adjusted under 35 U.S.C. 154(b) by 336 days.

(21) Appl. No.: 14/325,110

(22) Filed: Jul. 7, 2014

(65) Prior Publication Data

US 2015/0228664 A1    Aug. 13, 2015

(30) Foreign Application Priority Data

Feb. 10, 2014    (KR) .......................... 10-2014-0014830

(51) Int. Cl.
| | | |
|---|---|---|
| *H01L 37/00* | (2006.01) | |
| *H01L 27/12* | (2006.01) | |
| *G02F 1/1362* | (2006.01) | |
| *H01L 21/768* | (2006.01) | |

(52) U.S. Cl.
CPC ..... *H01L 27/1259* (2013.01); *G02F 1/136227* (2013.01); *G02F 1/136259* (2013.01); *H01L 27/1225* (2013.01); *H01L 27/1248* (2013.01); *G02F 2001/136218* (2013.01); *G02F 2001/136222* (2013.01);

(Continued)

(58) Field of Classification Search
CPC ............ H01L 27/1248; H01L 27/1259; H01L 27/1222; H01L 27/1225; H01L 21/76894; H01L 2251/568; G02F 1/136227; G02F 1/136259; G02F 2001/136218; G02F 2001/136222

See application file for complete search history.

(56) References Cited

U.S. PATENT DOCUMENTS 7,352,432 B2    4/2008  Yokogawa et al.
2007/0285593 A1  12/2007  Yamashita
(Continued)

FOREIGN PATENT DOCUMENTS

KR    10-2005-0068379    7/2005
KR    10-2007-0071796    7/2007
(Continued)

*Primary Examiner* — Caleb Henry
*Assistant Examiner* — Alexander Belousov
(74) *Attorney, Agent, or Firm* — Innovation Counsel LLP

(57) ABSTRACT

A display substrate includes a first switching element, an organic layer disposed on the first switching element, a capping layer disposed on the organic layer and a cover electrode covering the first emission hole. The first switching element is electrically connected to a gate line extending in a first direction, a data line extending in a second direction crossing the first direction and the pixel electrode disposed adjacent to the data line. The capping layer includes a first emission hole. The cover electrode overlaps the gate line as a first width. The cover electrode overlaps the first switching element as a second width. The second width is smaller than the first width.

10 Claims, 24 Drawing Sheets

(52) U.S. Cl.
CPC .... *H01L 21/76894* (2013.01); *H01L 27/1222* (2013.01); *H01L 2251/568* (2013.01)

(56) References Cited

U.S. PATENT DOCUMENTS

| | | | | |
|---|---|---|---|---|
| 2008/0117344 | A1* | 5/2008 | Kim et al. | H01L 27/1248 349/39 |
| 2010/0155734 | A1* | 6/2010 | Lee et al. | G02F 1/136259 257/59 |
| 2010/0163881 | A1* | 7/2010 | Kang et al. | H01L 27/1288 257/59 |
| 2013/0329158 | A1* | 12/2013 | Kanamori | G02F 1/136213 349/43 |
| 2015/0103282 | A1* | 4/2015 | Park et al. | H01L 27/1248 349/44 |

FOREIGN PATENT DOCUMENTS

| | | |
|---|---|---|
| KR | 10-2008-0086119 | 9/2008 |
| KR | 10-2012-0043850 | 5/2012 |

\* cited by examiner

DISPLAY SUBSTRATE AND METHOD OF MANUFACTURING THE SAME

PRIORITY STATEMENT

This application claims priority under 35 U.S.C. §119 to Korean Patent Application No. 10-2014-0014830, filed on Feb. 10, 2014 in the Korean Intellectual Property Office KIPO, the contents of which are herein incorporated by reference in their entireties.

BACKGROUND

1. Field

The present inventive concept relates to a display substrate and method of manufacturing the display substrate. More particularly, the present inventive concept relates to a display substrate capable of increasing success rate of repair and method of manufacturing the display substrate.

2. Description of the Related Art

Recently, a liquid display apparatus having light weight and small size has been manufactured. A cathode ray tube (CRT) display apparatus has been used due to a performance and a competitive price. However the CRT display apparatus has a weakness for size or portability. Therefore the liquid display apparatus has been highly regarded due to small size, light weight and low-power-consumption of the liquid display apparatus.

Generally, a liquid crystal display (LCD) panel includes a thin film transistor (TFT) substrate, an opposing substrate and an LC layer. The TFT substrate includes a plurality of gate lines, a plurality of data lines crossing the gate lines, a plurality of TFTs connected with the gate lines and data lines, and a plurality of pixel electrodes connected to the TFTs. The TFT includes a gate electrode extending from the gate line, a source electrode extending from the data line, and a drain electrode spaced apart from the source electrode.

In the manufacturing process of the liquid display apparatus, when a failure of a pixel or a data line is occurred, a laser repair is used to disconnect a wiring. Particularly, a failure due to a short of a gate line and a data line is occurred, a drain-neck-cutting is used as a method of repair. The drain-neck-cutting is a method of repair disconnecting a signal from the data line to the drain. The drain-neck-cutting is performed by cutting a line extending from the data line to a transistor by a laser.

However, when the drain-neck-cutting is performed in an area in which a cover electrode is formed, short circuit between the data line and the cover electrode is occurred. Accordingly, success rate of repair may be decreased.

SUMMARY

Exemplary embodiments of the present inventive concept provide a display substrate capable of increasing success rate of repair.

Exemplary embodiments of the present inventive concept further provide method of manufacturing the display substrate.

In an exemplary embodiment of a display substrate according to the present inventive concept, the display substrate includes a first switching element, an organic layer disposed on the first switching element, a capping layer disposed on the organic layer and a cover electrode covering the first emission hole. The first switching element is electrically connected to a gate line extending in a first direction, a data line extending in a second direction crossing the first direction and the pixel electrode disposed adjacent to the data line. The capping layer includes a first emission hole. The cover electrode overlaps the gate line as a first width. The cover electrode overlaps the first switching element as a second width. The second width is smaller than the first width.

In an exemplary embodiment, the cover electrode may include a first side extending in a first direction, and a second side opposing the first side and shorter than the first side. The cover electrode may have an "L" shape. The first side may overlap the gate line. The first switching element may be a source electrode extension portion connecting a source electrode to the data line.

In an exemplary embodiment, the cover electrode may include a first side extending in a first direction, and a second side opposing the first side and shorter than the first side. The cover electrode may have a trapezoid shape. The first side may overlap the gate line.

In an exemplary embodiment, the cover electrode may include a first side extending in a first direction, a second side opposing the first side and shorter than the first side, a third side extending in the first direction, a fourth side opposing the third side and shorter than the third side, and a fifth side connecting the second side and the fourth side. The first side may overlap the gate line.

In an exemplary embodiment, the display substrate may further include a shielding line spaced apart from the high pixel electrode to overlap the data line. The organic layer may be a color filter.

In an exemplary embodiment, the cover electrode and the high pixel electrode may be formed from a same layer.

In an exemplary embodiment, the display substrate may further include a second switching element electrically connected to the gate line and a third switching element electrically connected to the gate line and the second switching element. The data line and a low pixel electrode may be spaced apart from the high pixel electrode. The capping layer may have a second emission hole smaller than the cover electrode.

In an exemplary embodiment, the display substrate may further include a high storage line overlapped with the high pixel electrode and a low storage line overlapped with the low pixel electrode.

In an exemplary embodiment, the third switching element may be electrically connected with the high storage line.

In an exemplary embodiment, the high storage line may include a first high storage line extending in the first direction and a second high storage line extending in the second direction. The low storage line may include a first low storage line extending in the first direction and a second low storage line extending in the second direction.

In an exemplary embodiment of a method of manufacturing a display substrate according to the present inventive concept, the method includes forming a first switching element, forming an insulation layer on the first switching element, forming an organic layer on the insulation layer, forming a capping layer having a first emission hole on the organic layer, forming a cover electrode to cover the first emission hole, the cover electrode overlapping the gate line by a first width and overlapping the first switching element by a second width, and forming a cover electrode covering the cover electrode. The first switching element is electrically connected to a gate line extending in a first direction, a data line extending in a second direction crossing the first direction and the high pixel electrode disposed adjacent to the data line. The second width is smaller than the first width.

In an exemplary embodiment, the cover electrode may include a first side extending in a first direction, and a second side opposing the first side and shorter than the first side. The cover electrode may have an "L" shape. The first side may overlap the gate line. The cover electrode may overlap a source electrode extension portion connecting the source electrode to the data line by the second width.

In an exemplary embodiment, the cover electrode may include a first side extending in a first direction, and a second side opposing the first side and shorter than the first side. The cover electrode may have a trapezoid shape. The first side may overlap the gate line.

In an exemplary embodiment, the cover electrode may include a first side extending in a first direction, a second side opposing the first side and shorter than the first side, a third side extending in the first direction, a fourth side opposing the third side and shorter than the third side, and a fifth side connecting the second side and the fourth side. The first side may overlap the gate line.

In an exemplary embodiment, forming the cover electrode may include forming a shielding line spaced apart from the high pixel electrode to overlap the data line. The organic layer may be a color filter.

In an exemplary embodiment, the cover electrode and the high pixel electrode may be formed from a same layer.

In an exemplary embodiment, forming the first switching element may include forming a second switching element and forming a third switching element. The second switching element may be electrically connected to the gate line, the data line and a low pixel electrode spaced apart from the high pixel electrode. The third switching element may be electrically connected to the gate line and the second switching element. Forming the first emission hole may include a second emission hole smaller than the first emission hole.

In an exemplary embodiment, forming the first switching element may include forming a high storage line overlapped with the high pixel electrode and forming a low storage line overlapped with the low pixel electrode.

In an exemplary embodiment, the third switching element may be electrically connected with the high storage line.

In an exemplary embodiment, the high storage line may include a first high storage line extending in the first direction and a second high storage line extending in the second direction. The low storage line may include a first low storage line extending in the first direction and a second low storage line extending in the second direction.

According to the present inventive concept as explained above, a portion of the source electrode of the switching element not overlapping the emission hole is relatively wide. Thus, success rate of repair may be increased.

In addition, success rate of repair is increased, so that failure of the display apparatus may be decreased. Thus, quality of the display apparatus may be improved.

BRIEF DESCRIPTION OF THE DRAWINGS

The above and other features and advantages of the present inventive concept will become more apparent by describing in detailed exemplary embodiments thereof with reference to the accompanying drawings, in which.

DETAILED DESCRIPTION OF THE INVENTIVE CONCEPT

Hereinafter, the present invention will be explained in detail with reference to the accompanying drawings.

Figure 1:
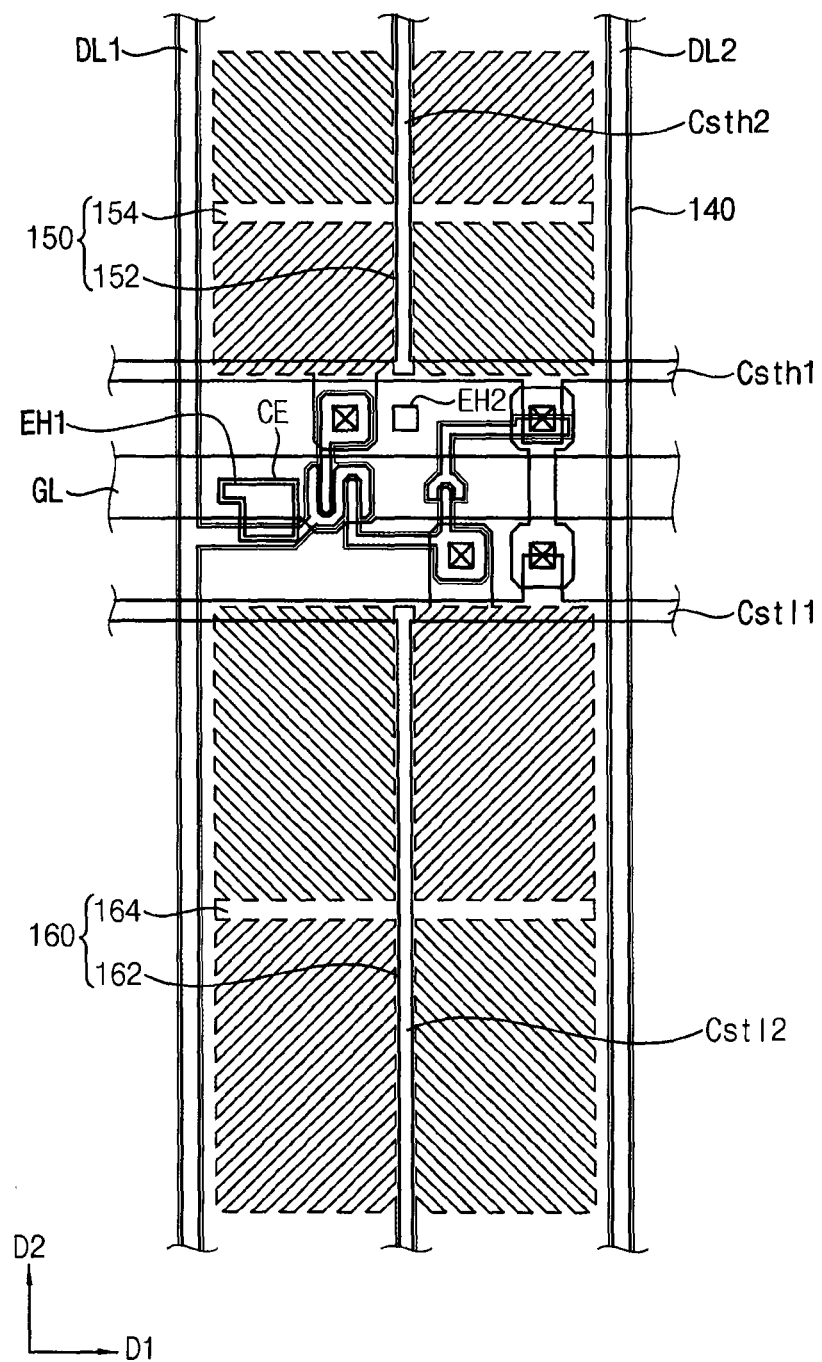
FIG. 1 is a plan view illustrating a pixel of a display substrate according to an exemplary embodiment of the inventive concept.
Figure 2:
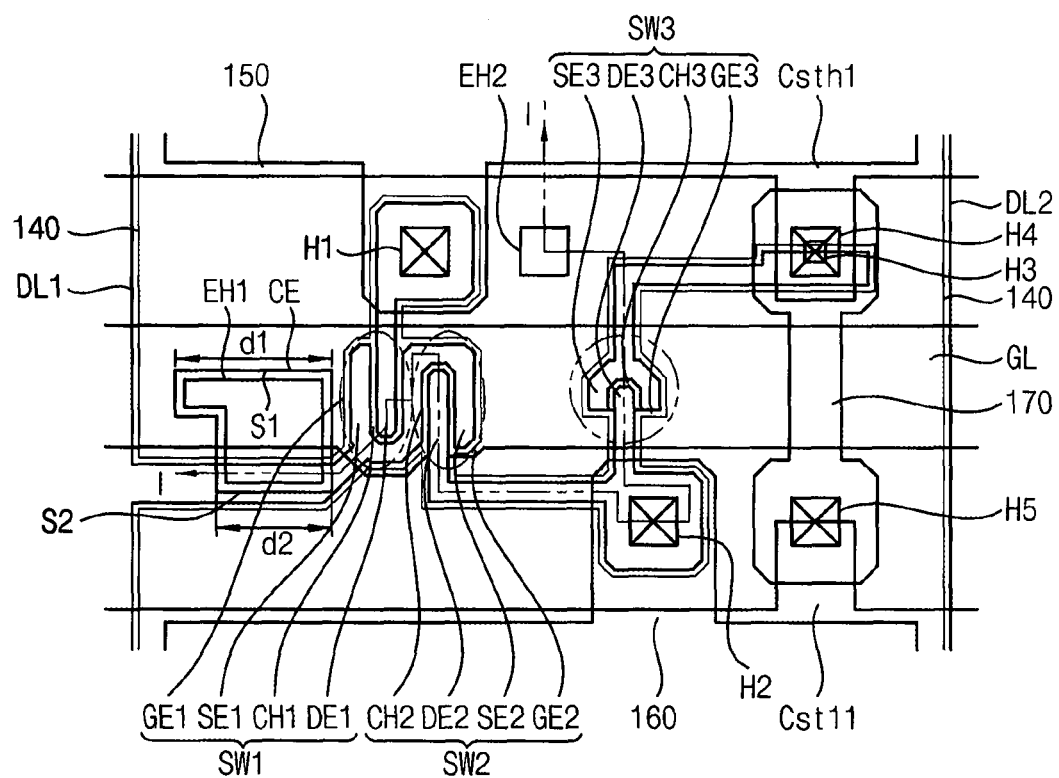
FIG. 2 is a partially enlarged view illustrating a switching element of FIG. 1.

FIG. 1 is a plan view illustrating a pixel of a display substrate according to an exemplary embodiment of the inventive concept. FIG. 2 is a partially enlarged view illustrating a switching element of FIG. 1.

Referring to FIGS. 1 and 2, a display panel includes a gate line GL, a first data line DL1, a second data line DL2, a first high storage line Csth1, a second high storage line Csth2, a first low storage line Cstl1, a second low storage line Cstl2, a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The gate line GL extends in a first direction D1. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first data line DL1 extends in a second direction D2 substantially perpendicular to the first direction D1, and crosses the gate line GL. The first data line DL1 is electrically connected to a first source electrode portion SE1 of the first switching element SW1, and a second source electrode SE2 of the second switching element SW2.

The second data line DL2 is spaced apart from the first data line DL1, and extends in the second direction D2, and crosses the gate line GL. The second data line DL2 is electrically connected to a first source electrode of the first switching element, and a second source electrode of the second switching element of the adjacent pixel.

The channel layer 140 may entirely cover a lower surface of a data pattern. The data pattern may include the first data line DL1, the second data line DL2, a first source electrode portion SE1 and a first drain electrode DE1 of the first switching element SW1, a second source electrode SE2 and a second drain electrode DE2 of the second switching element SW2, a third source electrode SE3 and a third drain electrode DE3 of the third switching element SW3. The channel layer 140 and the data pattern may be formed by using the same mask. Thus, the channel layer 140 may be formed as a shape corresponding to the data pattern. In the present exemplary embodiment, the channel layer 140 and the data pattern may be formed by using the same mask, so that the number of process and a manufacturing cost may be decreased.

The high pixel electrode 150 may be disposed adjacent to the gate line GL in the second direction D2, and between the first data line DL1 and the second data line DL2. The high pixel electrode 150 is electrically connected to a first drain electrode DE1 of the first switching element SW1 through a first contact hole H1.

The high pixel electrode 150 includes a first stem 152 extending in the second direction D2, and a second stem 154 extending in the first direction D1 and crossing the first stem 152. The first and second stems 152 and 154 may divide the high pixel electrode 150 into four domains. For example, the first and second stems 152 and 154 passes a center of the high pixel electrode 150, and divides the high pixel electrode 150 into four domains each of which has same area.

In each of the domains, a plurality of branches extending from the first or second stems 152 or 154 is formed. The branches form a plurality of slits. The branches may be formed having different directions in each of the four domains. The branches may be opened at boundaries of the high pixel electrode 150.

The low pixel electrode 160 is disposed opposite to the high pixel electrode 150 with reference to the gate line GL, and between the first data line DL1 and the second data line DL2. The low pixel electrode 160 is electrically connected to the second drain electrode DE2 of the second switching element SW2 and the third drain electrode DE3 of the third switching element SW3 through a second contact hole H2.

The low pixel electrode 160 includes a first stem 162 extending in the second direction D2, and a second stem 164 extending in the first direction D1 and crossing the first stem 162. The first and second stems 162 and 164 may divide the low pixel electrode 160 into four domains. For example, the first and second stems 162 and 164 passes a center of the low pixel electrode 160, and divides the low pixel electrode 160 into four domains each of which has same area.

In each of the domains, a plurality of branches extending from the first or second stems 162 or 164 is formed. The branches form a plurality of slits in which the low pixel electrode is not formed. The branches may be formed having different directions in each of the four domains. The branches may be opened at boundaries of the low pixel electrode 160.

A first voltage may be applied to the high pixel electrode 150. A second voltage different from the first voltage may be applied to the low pixel electrode 160. For example, the first voltage may be higher than the second voltage, a portion of the pixel corresponding to the high pixel electrode 150 may be driven as a high pixel, and another portion of the pixel corresponding to the low pixel electrode 160 may be driven as a low pixel.

The first high storage line Csth1 extends in the first direction D1. The first high storage line Csth1 is disposed between the first data line DL1 and the second data line DL2. The first high storage line Csth1 may overlap a boundary of the high pixel electrode 150. The first high storage line Csth1 is electrically connected to the third source electrode SE3 of the third switching element SW3 though a third contact hole H3. The first high storage line Csth1 is electrically connected to the connecting electrode 170 through a fourth contact hole H4.

The second high storage line Csth2 is disposed between the first data line DL1 and the second data line DL2, and extends in the second direction D2. The second high storage line Csth2 overlaps the high pixel electrode 150. The second high storage line Csth2 is electrically connected to the first high storage line Csth1. The second high storage line Csth2 is disposed in the middle of the high pixel electrode 150, so that the second high storage line Csth2 divides the high pixel electrode 150 into two portions. The second high storage line Csth2 overlaps the first stem 152 of the high pixel electrode 150.

The first low storage line Cstl1 is disposed adjacent to the gate line GL, and opposite to the first high storage line Csth1 with reference to the gate line GL. The first low storage line Cstl1 extends in the first direction D1. The first low storage line Cstl1 may overlap a boundary of the low pixel electrode 160. The first low storage line Cstl1 is electrically connected to the connecting electrode 170 through a fifth contact hole H5. Thus, the first high storage line Csth1 and the first low storage line Cstl1 are connected through the connecting electrode 170.

The second low storage line Cstl2 is disposed between the first data line DL1 and the second data line DL2, and extends in the second direction D2. The second low storage line Cstl2 overlaps the low pixel electrode 160. The second low storage line Cstl2 is electrically connected to the first low storage line Cstl1. The second low storage line Cstl2 is disposed in the middle of the low pixel electrode 160, so that the second low storage line Cstl2 divides the low pixel electrode 160 to two portions. The second low storage line Cstl2 overlaps the first stem 162 of the low pixel electrode 160.

The second high storage line Csth2 is electrically connected to a second low storage line of an adjacent pixel in the second direction D2. In addition, the second low storage line Cstl2 is electrically connected to a second high storage line of an adjacent pixel in the second direction D2. Thus, in the whole display panel, second high storage lines and second low storage lines are connected along the second direction D2.

The first switching element SW1 includes the first gate electrode GE1, the first source electrode portion SE1, the first drain electrode DE1 and a first channel portion CH1 connecting the first source electrode portion SE1 to the first drain electrode DE1. The first source electrode portion SE1 includes a first source electrode extension portion extending substantially parallel to the gate line GL and connected to the first data line DL1 to the first source electrode.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 170 is electrically connected to the third source electrode SE3 of the third switching element SW3 and the first high storage line Csth1 through the third contact hole H3 and the fourth contact hole H4. In addition, the connecting electrode 170 extends in the second direction D2, and electrically connected to the first low storage line Cstl1 through the fifth contact hole H5.

The first emission hole EH1 and the cover electrode CE partially overlaps the gate line GL and the first switching element SW1. The cover electrode CE may overlap the gate line GL by a first width d1. The cover electrode CE may overlap the first source electrode extension portion of the source electrode SE1 by a second width d2. The second width d2 may be smaller than the first width d1. The cover electrode CE may include a first side S1 extending in a first direction D1 and a second side S2 opposing the first side S1 and extending in the first direction D1. The second side is disposed closer to the source electrode extension portion than the first side. The second side S2 may be shorter than the first side S1. For example, the first emission hole EH1 and the cover electrode CE may be formed as an "L" shape. The first side S1 may overlap the gate line GL. A side extending in the first direction D1 of the first emission hole EH1 may be longer than a side extending in the second direction D2 of the first emission hole EH1. A side extending in the first direction D1 of the cover electrode CE may be longer than a side extending in the second direction D2 of the cover electrode CE. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first source electrode SE1 by a second width d2. The second width d2 may be smaller than the first width d1. The first source electrode extension portion of the first switching element SW1 not overlapping the cover electrode CE may be cut in a repair process. When the first source electrode extension portion of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the cover electrode CE is relatively wide. Thus, enough margins for laser repair is secured and success rate of repair may be increased.

Figure 3:
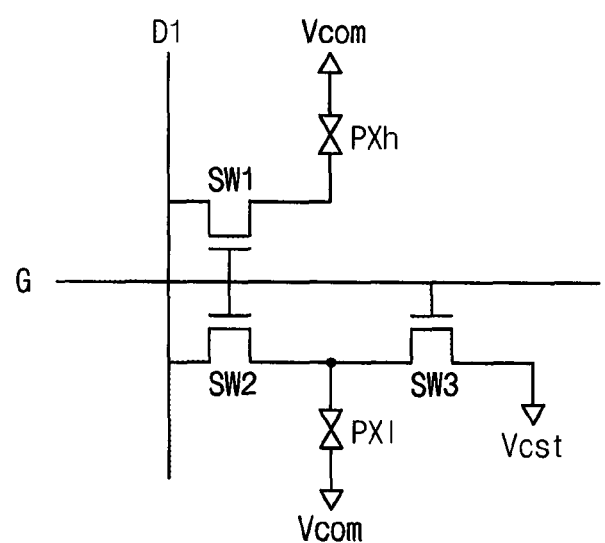
FIG. 3 is an equivalent circuit diagram of the pixel of FIG. 1.

FIG. 3 is an equivalent circuit diagram of the pixel of FIG. 1.

Referring to FIG. 3, a pixel of a display panel includes a first data line receiving a first data signal D1, a gate line receiving a gate signal G, a first switching element SW1, a second switching element SW2, a third switching element SW3, a high pixel liquid crystal capacitor PXh, and a low pixel liquid crystal capacitor PXl.

A source electrode of the first switching element SW1 is connected to the first data line. A gate electrode of the first switching element SW1 is connected to the gate line. A drain electrode of the first switching element SW1 is connected to the high pixel liquid crystal capacitor PXh. The high pixel liquid crystal capacitor PXh is formed by a high pixel electrode (refers 150 of FIG. 1), a common electrode to which a common voltage Vcom is applied and a liquid crystal layer.

A source electrode of the second switching element SW2 is connected to the first data line. A gate electrode of the second switching element SW2 is connected to the gate line. A drain electrode of the second switching element SW2 is connected to a drain electrode of the third switching element SW3 and the low pixel liquid crystal capacitor PXl. The low pixel liquid crystal capacitor PXl is formed by a low pixel electrode (refers 160 of FIG. 1), a common electrode to which a common voltage Vcom is applied, and a liquid crystal layer.

A storage voltage Vcst is applied to a source electrode of the third switching electrode SW3. The storage voltage Vcst is applied to first and second high storage lines (refers to Csth1 and Csth2 of FIG. 1) and first and second low storage lines (refers to Cstl1 and Cstl2 of FIG. 1). The first high storage line is connected to the source electrode of the third switching element SW3.

Although not shown in the figures, the high pixel electrode and the first and second high storage lines may form a high storage capacitor, and the low pixel electrode and the first and second low storage lines form a low storage capacitor.

Figure 4:
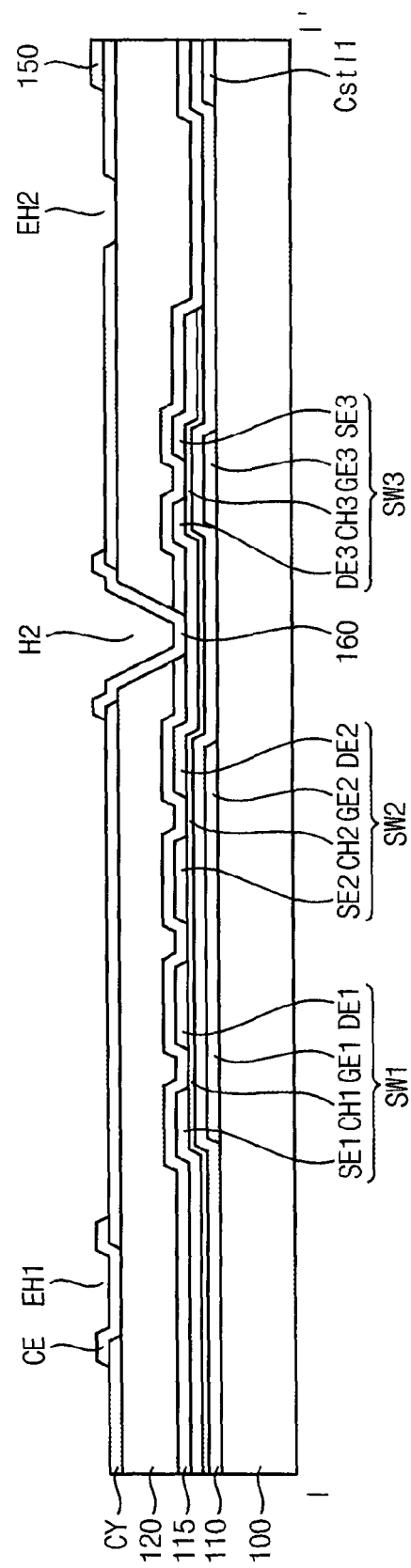
FIG. 4 is a cross-sectional view taken along a line I-I' of FIG. 2.

FIG. 4 is a cross-sectional view taken along a line I-I' of FIG. 2.

Referring to FIG. 4, a display substrate includes a base substrate 100, a gate pattern, a first insulation layer 110, a channel layer, a data pattern, a second insulation layer 115, a color filter layer 120, a capping layer CY, a high pixel electrode 150, a low pixel electrode 160 and cover electrode CE.

The first base substrate 100 may include a material which has relatively high transmittance, thermal resistance, and chemical resistance. For example the first base substrate 100 may include any one selected from the group consisting of glass, polyethylenenaphthalate, polyethylene terephthalate, polyacryl and a mixture thereof.

The gate pattern is disposed on the first base substrate 100. The gate pattern includes a first high storage line Csth1, a second high storage line (refers to Csth2 of FIG. 1), a first low storage line CstL1, a second low storage line (refers to Cstl2 of FIG. 1), a gate line GL, a first gate electrode GE1, a second gate electrode GE2 and a third gate electrode GE3.

The gate pattern may include a metal, a metal alloy, a metal nitride, a conductive metal oxide, a transparent conductive material, and etc. For example, the gate pattern may include copper (Cu) which is opaque.

The first insulation layer 110 is disposed on the gate pattern. The first insulation layer 110 covers and insulates the first high storage line Csth1, the second high storage line Csth2, the first low storage line Cstl1, the second low storage line Cstl2, the gate line GL, the first gate electrode GE1, the second gate electrode GE2 and the third gate electrode GE3.

The channel layer is dispose on the first insulation layer 110. The channel layer include a first channel portion CH1, a second channel portion CH2, and a third channel portion CH3. The first channel portion CH1 overlaps the first gate electrode GE1. The second channel portion CH2 overlaps the second gate electrode GE2. The third channel portion CH3 overlaps the third gate electrode GE3.

The data pattern is disposed on the channel layer. The data pattern includes a first drain electrode DE1, a first source electrode portion SE1, a second source electrode SE2, a second drain electrode DE2, a third source electrode SE3, a third drain electrode DE3, a first data line (refers to DL1 of FIG. 1) and a second data line (refers to DL2 of FIG. 1). The data pattern may include a metal, a metal alloy, a metal nitride, a conductive metal oxide, a transparent conductive material, and etc. For example, the data pattern may include copper (Cu) which is opaque.

The first drain electrode DE1, the first source electrode portion SE1, the first channel portion CH1 and the first gate electrode GE1 form a first switching element SW1.

The second drain electrode DE2, the second source electrode SE2, the second channel portion CH2 and the second gate electrode GE2 form a second switching element SW2. The second source electrode SE2 is electrically connected to the first source electrode portion SE1.

The third drain electrode DE3, the third source electrode SE3, third channel portion CH3 and the third gate electrode GE3 form a third switching element SW3. The third drain electrode DE3 is electrically connected to the second drain electrode DE2.

The second insulation layer 115 is disposed on the data pattern. The second insulation layer 115 covers and insulates the first drain electrode DE1, the first source electrode portion SE1, the second source electrode SE2, the second drain electrode DE2, the third source electrode SE3, the third drain electrode DE3, the first data line (refers to DL1 of FIG. 1) and the second data line (refers to DL2 of FIG. 1).

The color filter layer 120 is disposed on the second insulation layer 115. The color filter layer 120 supplies colors to the light passing through the liquid crystal layer. The color filter layer 120 may include a red color filter layer, a green color filter layer and blue color filter layer. The color filter layer 120 is formed on a region corresponds to a unit pixel. The color filter layers adjacent to each other in a first direction may have different colors. The color filter layer 120 may overlap adjacent color filter layer in a boundary of the adjacent unit pixels. In addition, the color filter layer 120 may be spaced apart from adjacent color filter layer in the boundary of the adjacent unit pixels.

A second contact hole H2 is formed through the second insulation layer 115 and the color filter layer 120, so that a portion of the second drain electrode DE2 (or the third drain electrode DE3) is exposed.

The capping layer CY is disposed on the color filter layer 120. The capping layer CY covers the color filter layer 120 to protect the color filter layer 120 and prevent the color filter layer 120 from being detached from the second insulation layer 115. For example, the capping layer CY may include silicon nitride or silicon oxide, and a refractive index of the capping layer CY may be about 1.7 to about 2.1.

The capping layer CY may have a first emission hole EH1 and a second emission hole EH2. A gas from the color filter layer 120 may be emitted through the first emission hole EH1 and the second emission hole EH2. A gas may be emitted from the color filter layer 120, so that portions in which the liquid crystal molecules are not filled up may be generated by the gas emitted from the color filter. However, in the present exemplary embodiment, a gas is removed through the first emission hole EH1 and the second emission hole EH2 formed on the capping layer CY before forming a liquid crystal layer. Thus, portions in which the liquid crystal molecules are not filled up may not be generated.

The cover electrode CE is disposed on the first emission hole EH1 and the second emission hole EH2. However, the cover electrode CE is not disposed on the second emission hole EH2. The cover electrode CE prevents the color filter layer 120 from contacting the liquid crystal. The cover electrode CE may be bigger than the first emission hole EH1 in a plan view, thus, may completely cover the emission holes EH1 and EH2. The cover electrode CE, the high pixel electrode 150 and the low pixel electrode 160 may be formed from a same layer. The cover electrode CE may not be disposed on the second emission hole EH2.

The high pixel electrode 150 is disposed on the capping layer CY. The high pixel electrode 150 is electrically connected to the first drain electrode DE1 through the first contact hole (refers to H1 of FIG. 2).

The low pixel electrode 160 is disposed on the capping layer CY. The low pixel electrode 160 is electrically connected to the second drain electrode DE2 (or the third drain electrode DE3) through the second contact hole H2. The cover electrode CE, the high pixel electrode 150 and the low pixel electrode 160 may be formed of a same layer.

FIGS. 5 to 11 are cross-sectional views illustrating a method of manufacturing the display substrate of FIG. 4.

Figure 5:
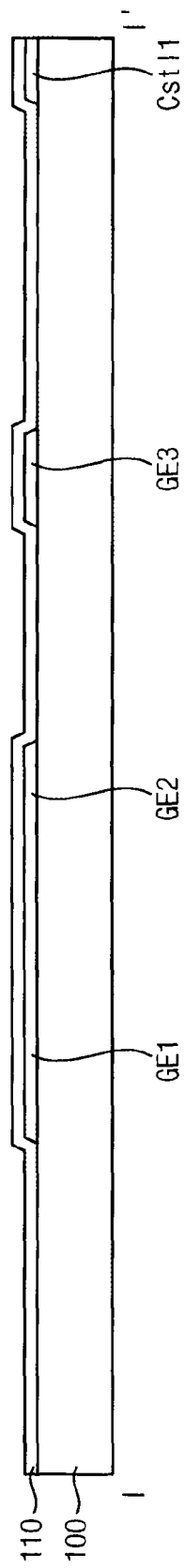
FIGS. 5 to 11 are cross-sectional views illustrating a method of manufacturing the display substrate of FIG. 4.

Referring to FIG. 5, a metal layer is formed on a first base substrate 100, and then the metal layer may be partially etched by a photo-etching process using an additional etching mask. Hence, the gate pattern is formed. The gate pattern includes a first high storage line Csth1, a second high storage line (refers to Csth2 of FIG. 1), a first low storage line CstL1, a second low storage line (refers to Cstl2 of FIG. 1), a gate line GL, a first gate electrode GE1, a second gate electrode GE2 and a third gate electrode GE3.

The gate line GL extends in a first direction D1. The gate line GL is electrically connected to a first gate electrode GE1, the second gate electrode GE2 and the third gate electrode GE3.

The first high storage line Csth1 extends in the first direction D1, and is disposed adjacent to the gate line GL.

A first insulation layer 110 is formed on the first base substrate 100 on which the gate pattern is formed. The first insulation layer 110 may be formed by a spin coating process, a printing process, a sputtering process, a CVD process, an ALD process, a PECVD process, an HDP-CVD process or a vacuum evaporation process in accordance with ingredients included in the first insulation layer 110.

Figure 6:
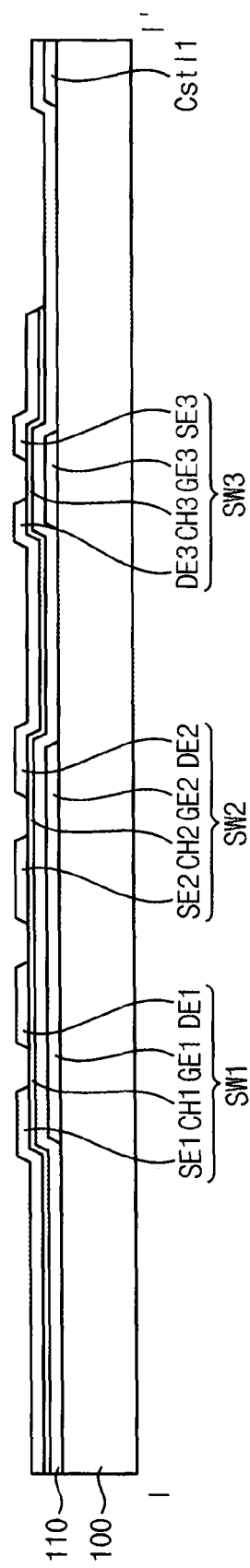

Referring to FIG. 6, a semiconductor layer and a metal layer are formed on the first insulation layer 110, and then the semiconductor layer and the metal layer may be partially etched by a photo-etching process using an additional etching mask. Hence, the channel layer having first to third channel portions CH1, CH2 and CH3, and a data pattern are formed. The semiconductor layer may include a silicon semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode portion SE1, a second source electrode SE2, a second drain electrode DE2, a third source electrode SE3, a third drain electrode DE3, a first data line DL1 and a second data line DL2. For example, the semiconductor layer and the metal layer are formed at the same time. Hence, the first source electrode portion SE1 and the first drain electrode DE1, the second source electrode SE2 and the second drain electrode DE2, and the third source electrode SE3 and the third drain electrode DE3 are formed. Each of the source electrodes is spaced apart from the associated drain electrodes by a channel length.

The first drain electrode DE1, the first source electrode portion SE1, the first channel portion CH1 and the first gate electrode GE1 form a first switching element SW1.

The second drain electrode DE2, the second source electrode SE2, the second channel portion CH2 and the second gate electrode GE2 form a second switching element SW2. The second source electrode SE2 is electrically connected to the first source electrode portion SE1.

The third drain electrode DE3, the third source electrode SE3, third channel portion CH3 and the third gate electrode GE3 form a third switching element SW3. The third drain electrode DE3 is electrically connected to the second drain electrode DE2.

Figure 7:
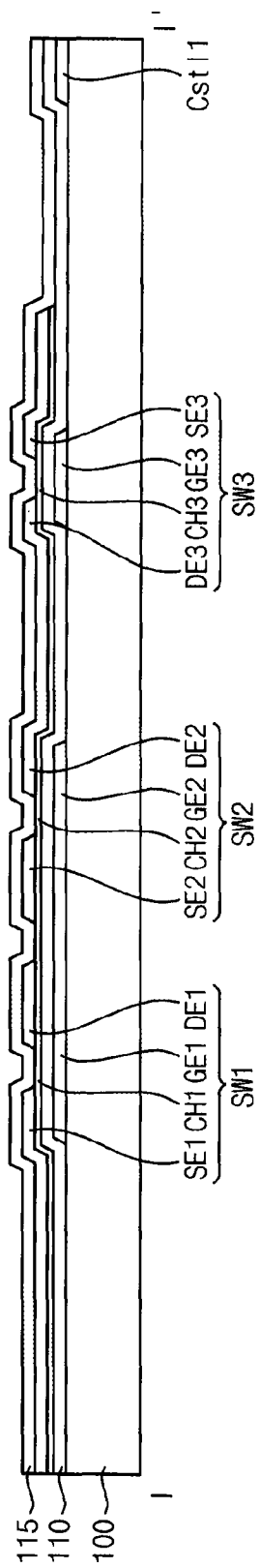

Referring to FIG. 7, a second insulation layer 115 is formed on the first base substrate 100 on which the data pattern is formed.

The second insulation layer 115 may be formed by a spin coating process, a printing process, a sputtering process, a CVD process, an ALD process, a PECVD process, an HDP-CVD process or a vacuum evaporation process in accordance with ingredients included in the second insulation layer 115. The second insulation layer 115 is disposed on the data pattern. The second insulation layer 115 covers and insulates the first drain electrode DE1, the first source electrode portion SE1, the second source electrode SE2, the second drain electrode DE2, the third source electrode SE3, the third drain electrode DE3, the first data line (refers to DL1 of FIG. 1) and the second data line (refers to DL2 of FIG. 1).

Figure 8:
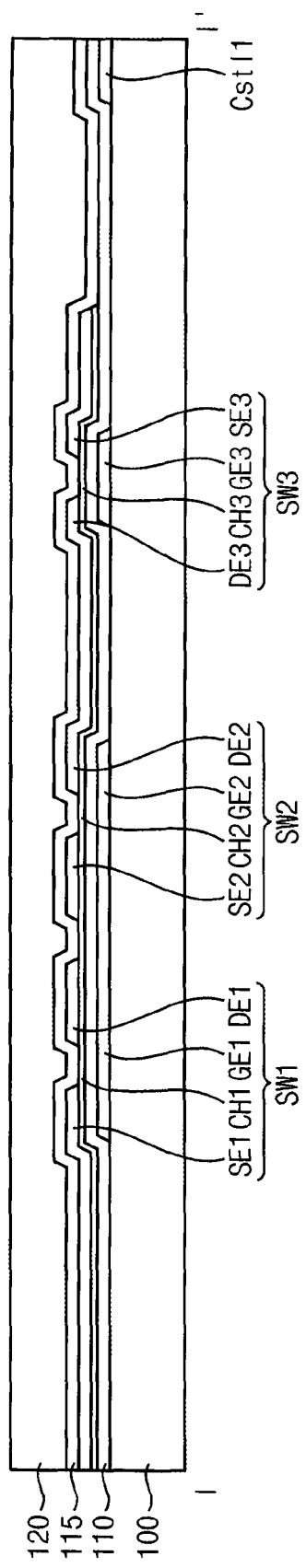

Referring to FIG. 8, a color filter layer 120 is formed on the first base substrate 100 on which the second insulation layer 115 is formed. A color filter layer is formed on the second insulation layer 115, and then the photoresist is exposed using a mask, and then the photoresist is developed using a developing solution. Hence, the color filter layer 120 may be formed.

The color filter layer 120 is disposed on the second insulation layer 115. The color filter layer 120 supplies colors to the light passing through the liquid crystal layer. The color filter layer 120 may include a red color filter layer, a green color filter layer and blue color filter layer. The color filter layer 120 is formed in a region corresponds to a unit pixel. The color filter layers adjacent to each other in a first direction may have different colors. The color filter layer 120 may overlap adjacent color filter layer in a boundary of the adjacent unit pixels. In addition, the color filter layer 120 may be spaced apart from adjacent color filter layer in the boundary of the adjacent unit pixels.

Figure 9:
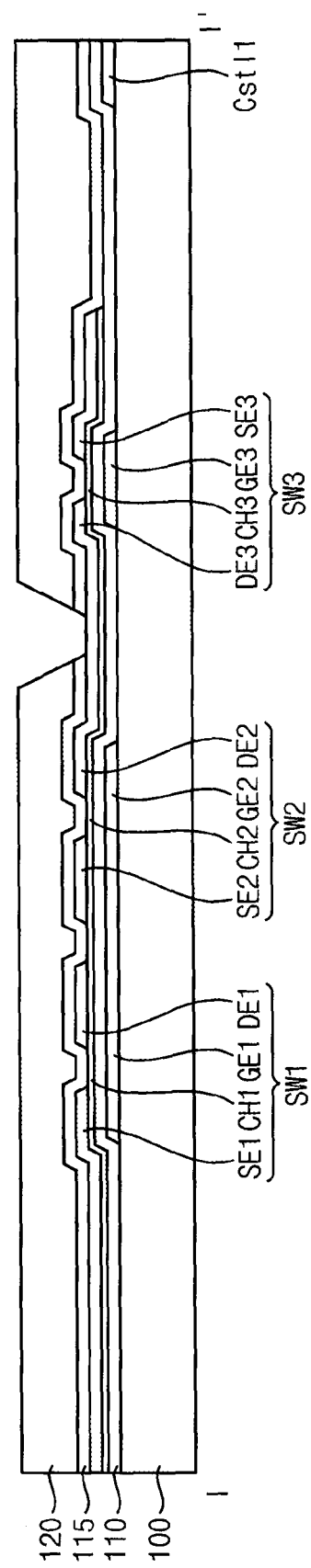

Referring to FIG. 9, contact holes including a second contact hole H2 is formed through the second insulation layer 115 and the color filter layer 120. The second contact hole H2 is formed through the second insulation layer 115 and the color filter layer 120, so that a portion of the drain electrodes including the second drain electrode DE2 (or the third drain electrode DE3) is exposed.

Figure 10:
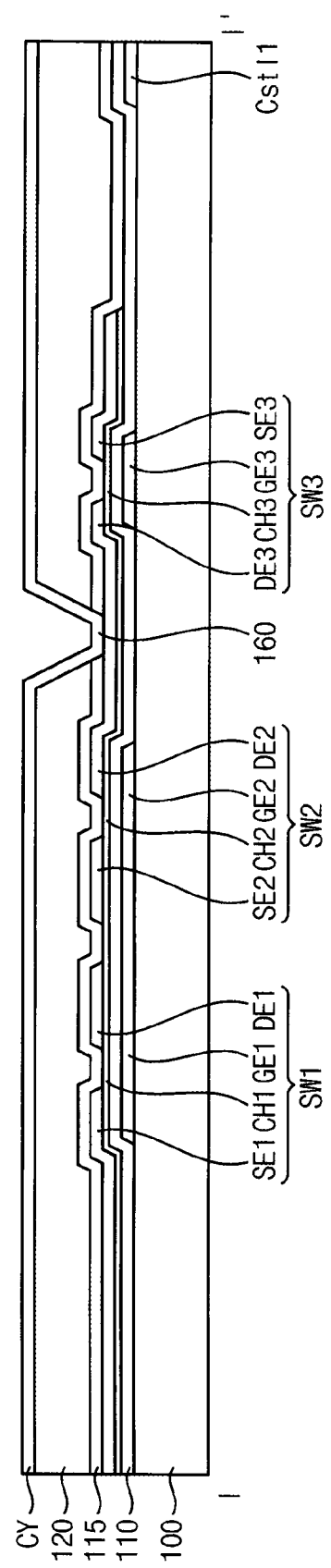

Referring to FIG. 10, a capping layer CY is disposed on the color filter layer 120 on which the second contact hole H2 is formed.

The capping layer CY is disposed on the color filter layer 120. The capping layer CY covers the color filter layer 120 to protect the color filter layer 120 and prevent the color filter layer 120 from being detached. For example, the capping layer CY may include silicon nitride or silicon oxide, and a refractive index of the capping layer CY may be about 1.7 to about 2.1.

Figure 11:
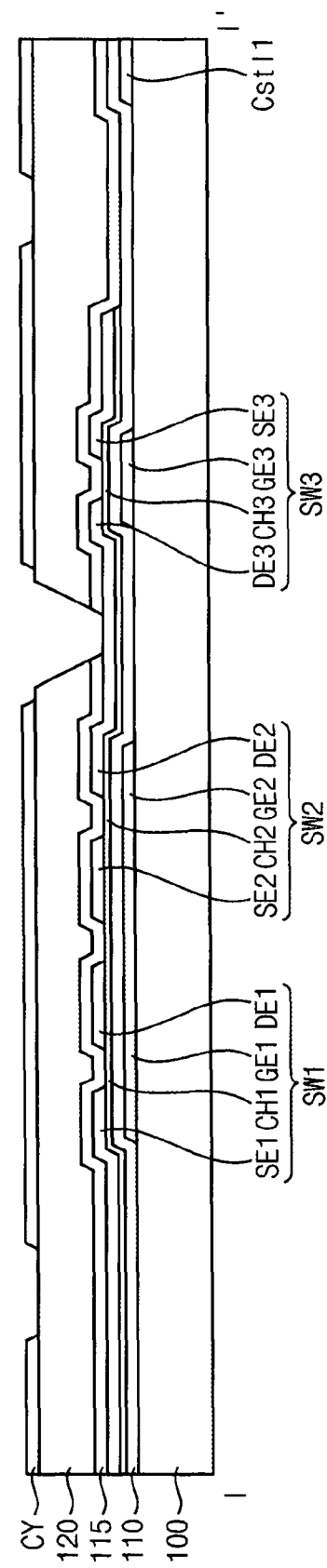

Referring to FIG. 11, the capping layer CY is patterned to form a first emission hole EH1 and a second emission hole EH2. The capping layer CY on the contact holes including the second contact hole H2 is removed at the same time.

The capping layer CY may have a first emission hole EH1 and a second emission hole EH2. A gas from the color filter layer 120 may be removed through the first emission hole EH1 and the second emission hole EH2. A gas may be emitted from the color filter layer 120, so that portions in which the liquid crystal molecules are not filled up may be generated. However, in the present exemplary embodiment, a gas is removed through the first emission hole EH1 and the second emission hole EH2 formed on the capping layer CY before filling with liquid crystal molecules. Thus, portions in which the liquid crystal molecules are not filled up may not be generated.

Referring to FIG. 4, a transparent conductive layer is formed on the capping layer CY, and then transparent conductive layer may be partially etched by a photo-etching process using an additional etching mask. Hence, a high pixel electrode 150, a low pixel electrode 160 and a cover electrode CE may be formed. The transparent conductive layer may include indium tin oxide (ITO), indium zinc oxide (IZO) and etc.

The high pixel electrode 150 is disposed adjacent to the gate line GL in the second direction D2, and between the first data line DL1 and the second data line DL2. The high pixel electrode 150 is electrically connected to a first drain electrode DE1 of the first switching element SW1 through a first contact hole H1.

The low pixel electrode 160 is disposed opposite to the high pixel electrode 150 with reference to the gate line GL, and between the first data line DL1 and the second data line DL2. The low pixel electrode 160 is electrically connected to the second drain electrode DE2 of the second switching element SW2 and the third drain electrode DE3 of the third switching element SW3 through a second contact hole H2. The high pixel electrode 150, the low pixel electrode 160 and the cover electrode CE may be formed of a same layer.

The cover electrode CE is disposed on the first emission hole EH1. The cover electrode CE prevents the color filter layer 120 from contacting the liquid crystal. The cover electrode CE may be bigger than the first emission hole EH1 in a plan view. Thus, the cover electrode CE completely covers the first emission hole. The cover electrode CE, the high pixel electrode 150 and the low pixel electrode 160 may be formed of a same layer. The cover electrode CE may or may not be disposed on the second emission hole EH2.

Figure 12:
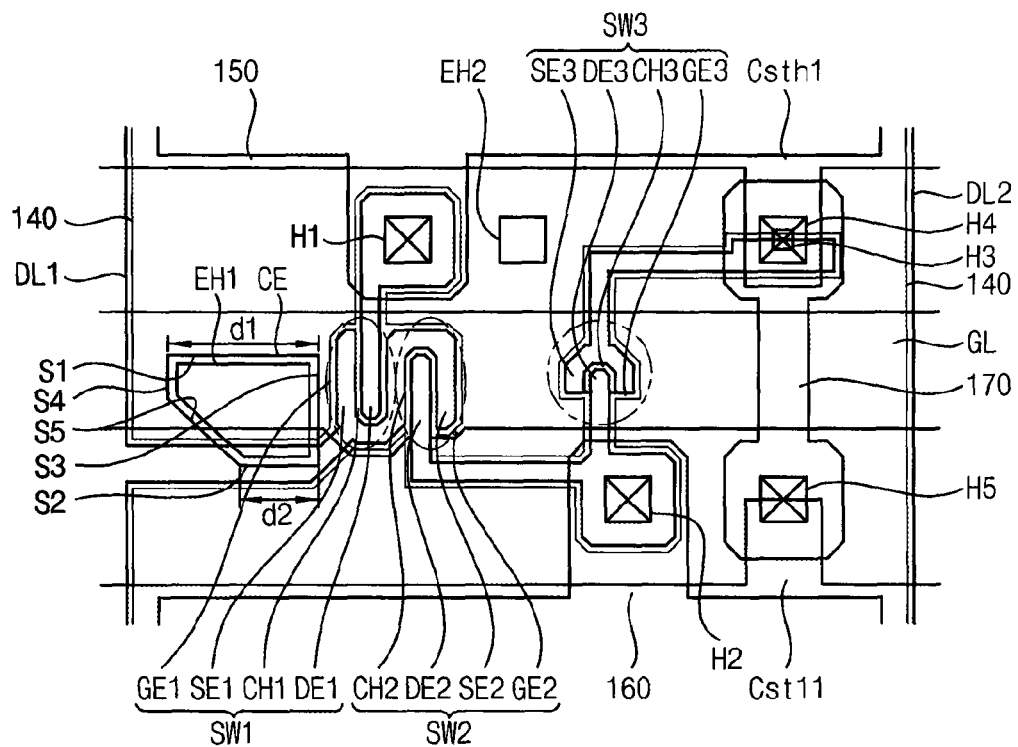
FIG. 12 is a partially enlarged view illustrating a switching element according to an exemplary embodiment of the inventive concept.

FIG. 12 is a partially enlarged view illustrating a switching element according to an exemplary embodiment of the inventive concept.

Referring to FIG. 12, a display panel includes a gate line GL, a first data line DL1, a second data line DL2, a first high storage line Csth1, a second high storage line Csth2, a first low storage line Cstl1, a second low storage line Cstl2, a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 170 is electrically connected to the third source electrode SE3 of the third switching element SW3 and the first high storage line Csth1 through the third contact hole H3 and the fourth contact hole H4. In addition, the connecting electrode 170 extends in the second direction D2, and electrically connected to the first low storage line Cstl1 through the fifth contact hole H5.

The first emission hole EH1 and the cover electrode CE partially overlap the gate line GL and the first switching element SW1. The cover electrode CE may overlap the gate line GL by a first width d1. The cover electrode CE may overlap the first source electrode extension portion of the first switching element SW1 by a second width d2. The second width d2 may be smaller than the first width d1. The cover electrode CE may include a first side S1 extending in a first direction D1 and a second side S2 extending in a first direction D1, opposing the first side S1 and shorter than the first side S1, a third side S3 extending in the second direction D2, a fourth side S4 extending in the second direction D2, opposing the third side S3 and shorter than the third side S3 and a fifth side S5 connecting the second side S2 and the fourth side S4. The first side S1 may overlap the gate line GL. A side extending in the first direction D1 of the cover electrode CE may be longer than a side extending in the second direction D2 of the cover electrode CE. The first emission hole EH1 may completely be covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first source electrode SE1 by a second width d2. The second width d2 may be smaller than the first width d1. The first source electrode extension portion of the first switching element SW1 not overlapping the cover electrode CE may be cut in a repair process. When a portion of the first source electrode portion SE1 of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the cover electrode CE is relatively wide. Thus, enough margins for laser repair are secured and success rate of repair may be increased.

Figure 13:
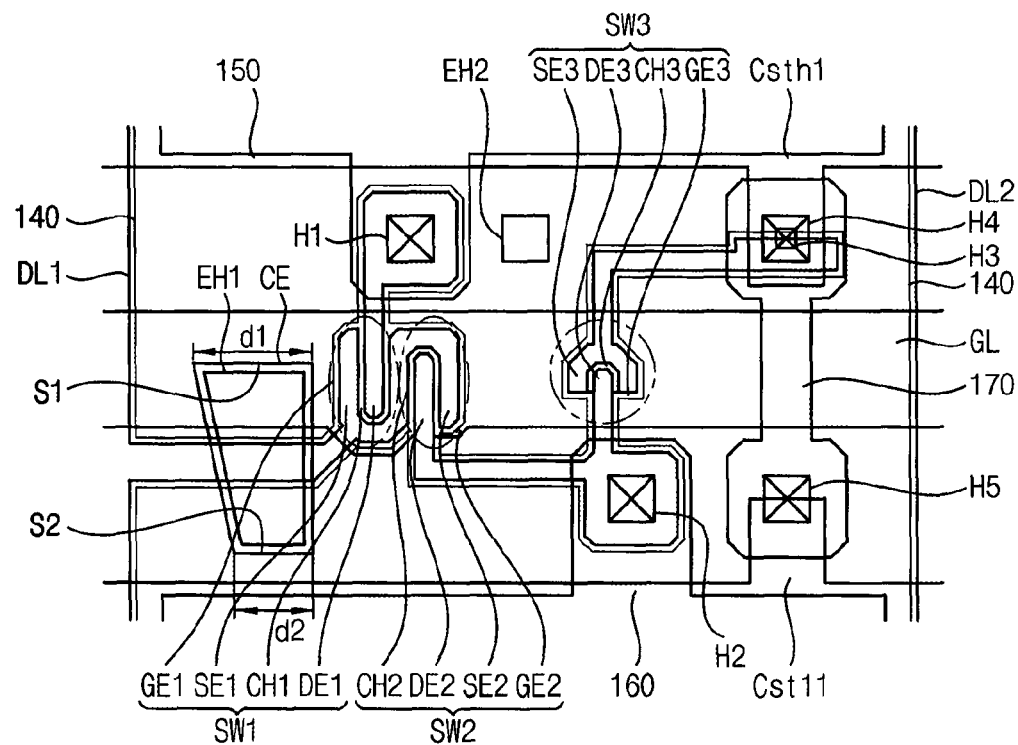
FIG. 13 is a partially enlarged view illustrating a switching element according to an exemplary embodiment of the inventive concept.

FIG. 13 is a partially enlarged view illustrating a switching element according to an exemplary embodiment of the inventive concept.

Referring to FIG. 13, a display panel includes a gate line GL, a first data line DL1, a second data line DL2, a first high storage line Csth1, a second high storage line Csth2, a first low storage line Cstl1, a second low storage line Cstl2, a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 170 is electrically connected to the third source electrode SE3 of the third switching element SW3 and the first high storage line Csth1 through the third contact hole H3 and the fourth contact hole H4. In addition, the connecting electrode 170 extends in the second direction D2, and electrically connected to the first low storage line Cstl1 through the fifth contact hole H5.

The first emission hole EH1 and the cover electrode CE partially overlap the gate line GL and the first switching element SW1. The cover electrode CE may overlap the gate line GL by a first width d1. The cover electrode CE may overlap the first source electrode extension portion of the first source electrode SE1 by a second width d2. The second width d2 may be smaller than the first width d1. The cover electrode CE may include a first side S1 extending in a first direction D1 and a second side S2 extending in the first direction and opposing the first side S1. The second side S2 may be shorter than the first side S1. For example, the first emission hole EH1 and the cover electrode CE may be formed as a trapezoid shape. The first side S1 may overlap the gate line GL. A side extending in the first direction D1 of the cover electrode CE may be longer than a side extending in the second direction D2 of the cover electrode CE. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first source electrode SE1 by a second width d2. The second width d2 may be smaller than the first width d1. The first source electrode extension portion of the first switching element SW1 not overlapping the cover electrode CE may be cut in a repair process. When a portion of the first source electrode portion SE1 of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the first emission hole EH1 is relatively wide. Thus, enough margins for laser repair are secured and success rate of repair may be increased.

Figure 14:
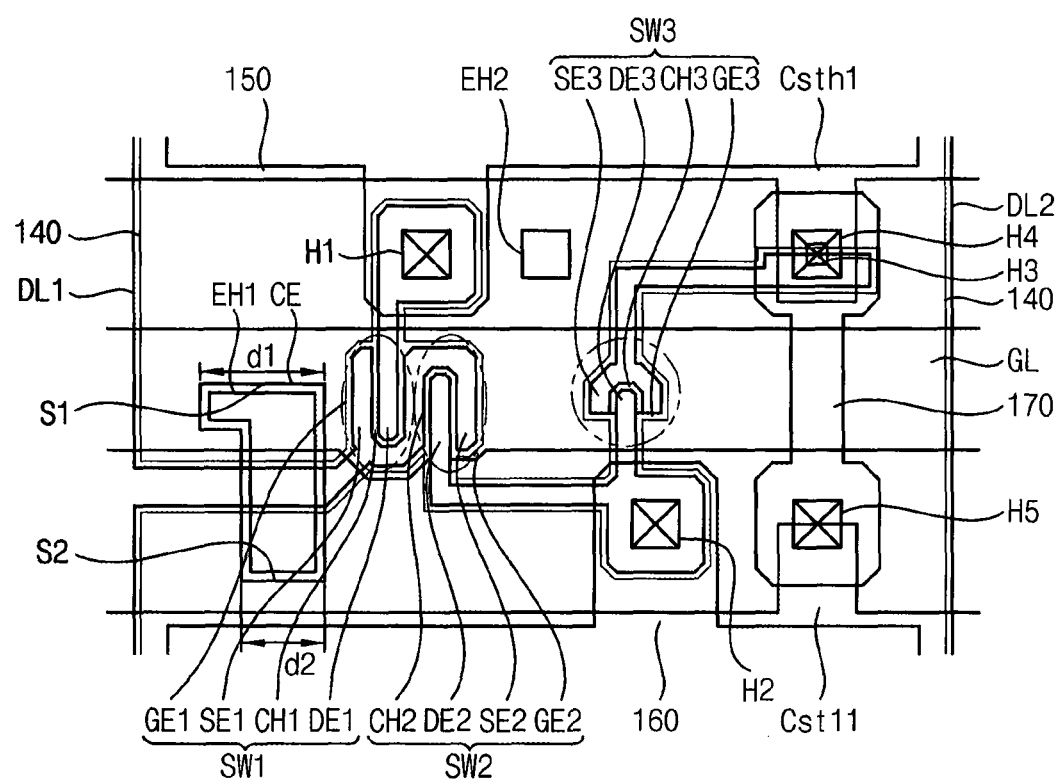
FIG. 14 is a partially enlarged view illustrating a switching element according to an exemplary embodiment of the inventive concept.

FIG. 14 is a partially enlarged view illustrating a switching element according to an exemplary embodiment of the inventive concept.

Referring to FIG. 14, a display panel includes a gate line GL, a first data line DL1, a second data line DL2, a first high storage line Csth1, a second high storage line Csth2, a first low storage line Cstl1, a second low storage line Cstl2, a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 170 is electrically connected to the third source electrode SE3 of the third switching element SW3 and the first high storage line Csth1 through the third contact hole H3 and the fourth contact hole H4. In addition, the connecting electrode 170 extends in the second direction D2, and electrically connected to the first low storage line Cstl1 through the fifth contact hole H5.

The first emission hole EH1 and the cover electrode CE partially overlap the gate line GL and the first switching element SW1. The cover electrode CE may overlap the gate line GL by a first width d1. The cover electrode CE may overlap the first source electrode extension portion of the first switching element SW1 by a second width d2. The second width d2 may be smaller than the first width d1. The cover electrode CE may include a first side S1 extending in a first direction D1 and a second side S2 extending in the first direction and opposing the first side S1. The second side S2 may be shorter than the first side S1. For example, the first emission hole EH1 and the cover electrode CE may be formed as an "L" shape. The first side S1 may overlap the gate line GL. A side extending in the second direction D2 of the first emission hole EH1 may be longer than a side extending in the first direction D1 of the first emission hole EH1. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first switching element SW1 by a second width d2. The second width d2 may be smaller than the first width d1. The first source electrode extension portion of the first switching element SW1 not overlapping the cover electrode CE may be cut in a repair process. When a portion of the first source electrode portion SE1 of the first switching element SW1 overlapping the first emission hole EH1 is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the first emission hole EH1 is relatively wide. Thus, enough margins for laser repair are secured and success rate of repair may be increased.

Figure 15:
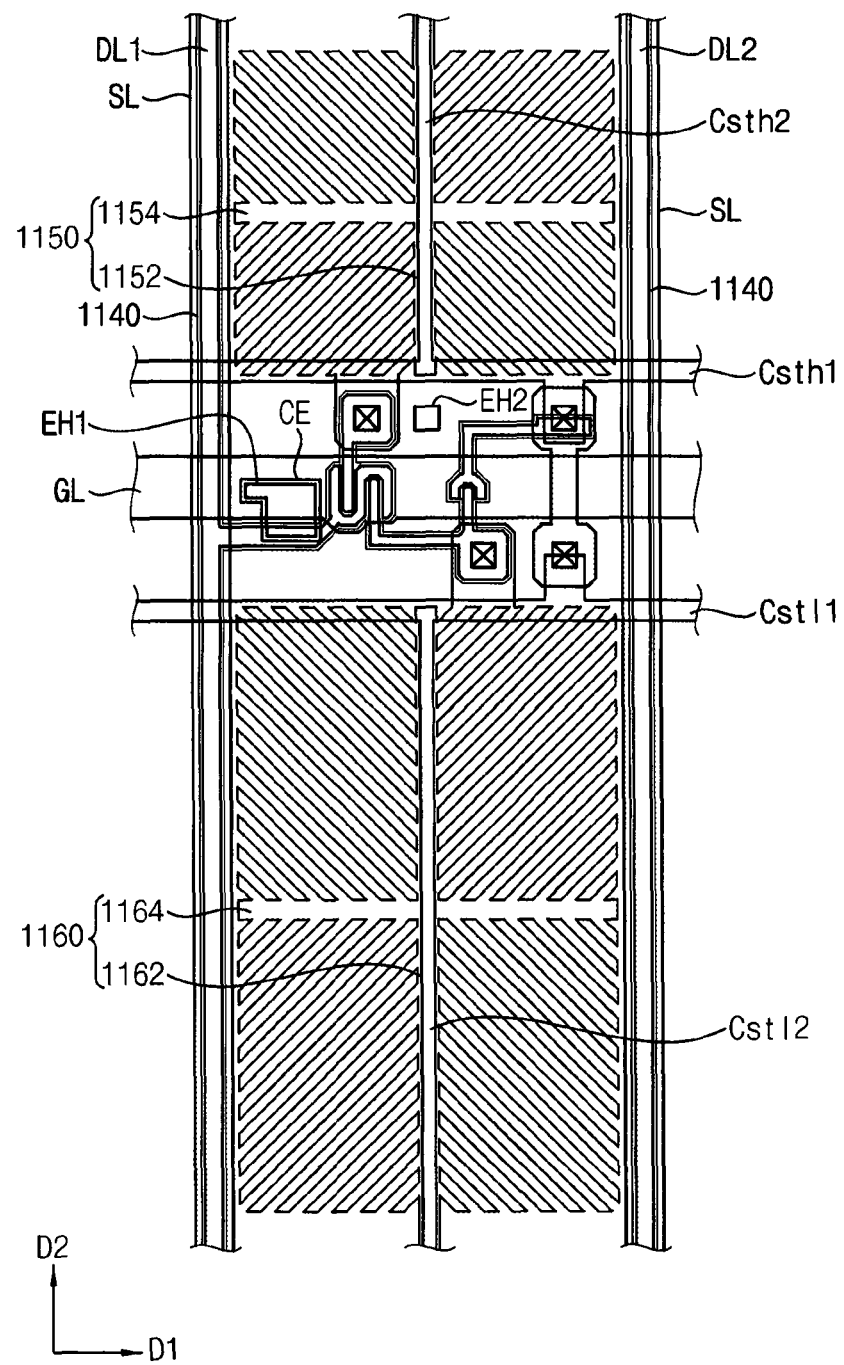
FIG. 15 is a plan view illustrating a pixel of a display substrate according to an exemplary embodiment of the inventive concept.
Figure 16:
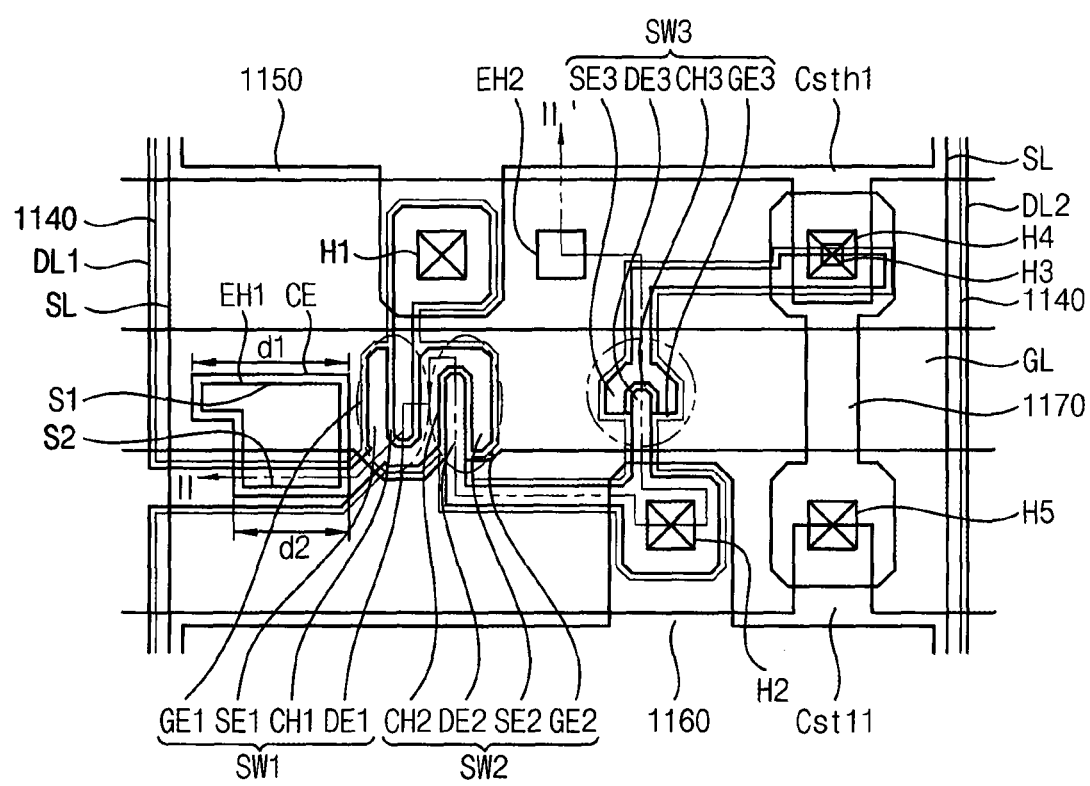
FIG. 16 is a partially enlarged view illustrating a switching element of FIG. 15.

FIG. 15 is a plan view illustrating a pixel of a display substrate according to an exemplary embodiment of the inventive concept. FIG. 16 is a partially enlarged view illustrating a switching element of FIG. 15.

Referring to FIGS. 15 and 16, a display panel includes a gate line GL, a first data line DL1, a second data line DL2, a shielding line SL, a first high storage line Csth1, a second high storage line Csth2, a first low storage line Cstl1, a second low storage line Cstl2, a first switching element SW1, a second switching element SW2, a third switching element SW3, a channel layer 1140, a high pixel electrode 1150, a low pixel electrode 1160, a connecting electrode 1170, a first emission hole EH1, a second emission hole EH2 and a cover electrode CE.

The gate line GL extends in a first direction D1. The gate line GL is electrically connected to a first gate electrode GE1 of the first switching element SW1, a second gate electrode GE2 of the second switching element SW2, and a third gate electrode GE3 of the third switching element SW3. In addition, portions of the gate line GL may form the first gate electrode GE1, the second gate electrode GE2, and the third gate electrode GE3.

The first data line DL1 extends in a second direction D2 substantially perpendicular to the first direction D1, and crosses the gate line GL. The first data line DL1 is electrically connected to a first source electrode portion SE1 of the first switching element SW1, and a second source electrode SE2 of the second switching element SW2.

The second data line DL2 is spaced apart from the first data line DL1, and extends in the second direction D2, and crosses the gate line GL. The second data line DL2 is electrically connected to a first source electrode of the first switching element, and a second source electrode of the second switching element of the adjacent pixel.

The channel layer 1140 may entirely cover a lower surface of a data pattern. The data pattern may include the first data line DL1, the second data line DL2, a first source electrode portion SE1 and a first drain electrode DE1 of the first switching element SW1, a second source electrode SE2 and a second drain electrode DE2 of the second switching element SW2, a third source electrode SE3 and a third drain electrode DE3 of the third switching element SW3. The channel layer 1140 and the data pattern may be formed by using the same mask. Thus, the channel layer 1140 may be formed as a shape corresponding to the data pattern. In the present exemplary embodiment, the channel layer 1140 and the data pattern may be formed by using the same mask, so that the number of process and a manufacturing cost may be decreased.

The high pixel electrode 1150 may be disposed adjacent to the gate line GL in the second direction D2, and between the first data line DL1 and the second data line DL2. The high pixel electrode 1150 is electrically connected to a first drain electrode DE1 of the first switching element SW1 through a first contact hole H1.

The high pixel electrode 1150 includes a first stem 1152 extending in the second direction D2, and a second stem 1154 extending in the first direction D1 and crossing the first stem 1152. The first and second stems 1152 and 1154 may divide the high pixel electrode 1150 into four domains. For example, the first and second stems 1152 and 1154 passes a center of the high pixel electrode 1150, and divides the high pixel electrode 1150 into four domains each of which has same area.

In each of the domains, a plurality of branches extending from the first or second stems 1152 or 1154 is formed. The branches form a plurality of slits. The branches may be formed having different directions in each of the four domains. The branches may be opened at boundaries of the high pixel electrode 1150.

The low pixel electrode 1160 is disposed opposite to the high pixel electrode 1150 with reference to the gate line GL, and between the first data line DL1 and the second data line DL2. The low pixel electrode 1160 is electrically connected to the second drain electrode DE2 of the second switching element SW2 and the third drain electrode DE3 of the third switching element SW3 through a second contact hole H2.

The low pixel electrode 1160 includes a first stem 1162 extending in the second direction D2, and a second stem 1164 extending in the first direction D1 and crossing the first stem 1162. The first and second stems 1162 and 1164 may divide the low pixel electrode 1160 into four domains. For example, the first and second stems 1162 and 1164 passes a center of the low pixel electrode 1160, and divides the low pixel electrode 1160 into four domains each of which has same area.

In each of the domains, a plurality of branches extending from the first or second stems 1162 or 1164 is formed. The branches form a plurality of slits in which the low pixel electrode is not formed. The branches may be formed having different directions in each of the four domains. The branches may be opened at boundaries of the low pixel electrode 1160.

A first voltage may be applied to the high pixel electrode 1150. A second voltage different from the first voltage may be applied to the low pixel electrode 1160. For example, the first voltage may be higher than the second voltage, a portion of the pixel corresponding to the high pixel electrode 1150 may be driven as a high pixel, and another portion of the pixel corresponding to the low pixel electrode 1160 may be driven as a low pixel.

The first high storage line Csth1 extends in the first direction D1. The first high storage line Csth1 is disposed between the first data line DL1 and the second data line DL2. The first high storage line Csth1 may overlap a boundary of the high pixel electrode 1150. The first high storage line Csth1 is electrically connected to the third source electrode SE3 of the third switching element SW3 though a third contact hole H3. The first high storage line Csth1 is electrically connected to the connecting electrode 1170 through a fourth contact hole H4.

The second high storage line Csth2 is disposed between the first data line DL1 and the second data line DL2, and extends in the second direction D2. The second high storage line Csth2 overlaps the high pixel electrode 1150. The second high storage line Csth2 is electrically connected to the first high storage line Csth1. The second high storage line Csth2 is disposed in the middle of the high pixel electrode 1150, so that the second high storage line Csth2 divides the high pixel electrode 1150 into two portions. The second high storage line Csth2 overlaps the first stem 1152 of the high pixel electrode 1150.

The first low storage line Cstl1 is disposed adjacent to the gate line GL, and opposite to the first high storage line Csth1 with reference to the gate line GL. The first low storage line Cstl1 extends in the first direction D1. The first low storage line Cstl1 may overlap a boundary of the low pixel electrode 1160. The first low storage line Cstl1 is electrically connected to the connecting electrode 1170 through a fifth contact hole H5. Thus, the first high storage line Csth1 and the first low storage line Cstl1 are connected through the connecting electrode 1170.

The second low storage line Cstl2 is disposed between the first data line DL1 and the second data line DL2, and extends in the second direction D2. The second low storage line Cstl2 overlaps the low pixel electrode 1160. The second low storage line Cstl2 is electrically connected to the first low storage line Cstl1. The second low storage line Cstl2 is disposed in the middle of the low pixel electrode 1160, so that the second low storage line Cstl2 divides the low pixel electrode 1160 to two portions. The second low storage line Cstl2 overlaps the first stem 1162 of the low pixel electrode 1160.

The second high storage line Csth2 is electrically connected to a second low storage line of an adjacent pixel in the second direction D2. In addition, the second low storage line Cstl2 is electrically connected to a second high storage line of an adjacent pixel in the second direction D2. Thus, in the whole display panel, second high storage lines and second low storage lines are connected along the second direction D2.

The shielding line SL is overlapped with the first data line DL1 and the second data line DL2. The shielding line SL may extend in the second direction D2. The shielding line SL may be a transparent conductive pattern formed from a transparent conductive layer. The shielding line SL, the high pixel electrode 1150 and the low pixel electrode 1160 may formed from a same layer.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 1170 is electrically connected to the third source electrode SE3 of the third switching element SW3 and the first high storage line Csth1 through the third contact hole H3 and the fourth contact hole H4. In addition, the connecting electrode 1170 extends in the second direction D2, and electrically connected to the first low storage line Cstl1 through the fifth contact hole H5.

The first emission hole EH1 and the cover electrode CE partially overlap the gate line GL and the first switching element SW1. The cover electrode CE may overlap the gate line GL by a first width d1. The cover electrode CE may overlap the first source electrode extension portion of the first source electrode SE1 by a second width d2. The second width d2 may be smaller than the first width d1. The cover electrode CE may include a first side S1 extending in a first direction D1 and a second side S2 extending in the first direction and opposing the first side S1. The second side S2 may be shorter than the first side S1. For example, the first emission hole EH1 and the cover electrode CE may be formed as an "L" shape. The first side S1 may overlap the gate line GL. A side extending in the first direction D1 of the first emission hole EH1 may be longer than a side extending in the second direction D2 of the first emission hole EH1. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first switching element SW1 by a second width d2. The second width d2 may be smaller than the first width d1. The first source electrode extension portion of the first switching element SW1 not overlapping the cover electrode CE may be cut in a repair process. When the first source electrode extension portion of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the cover electrode CE is relatively wide. Thus, enough margins for laser repair are secured and success rate of repair may be increased.

Figure 17:
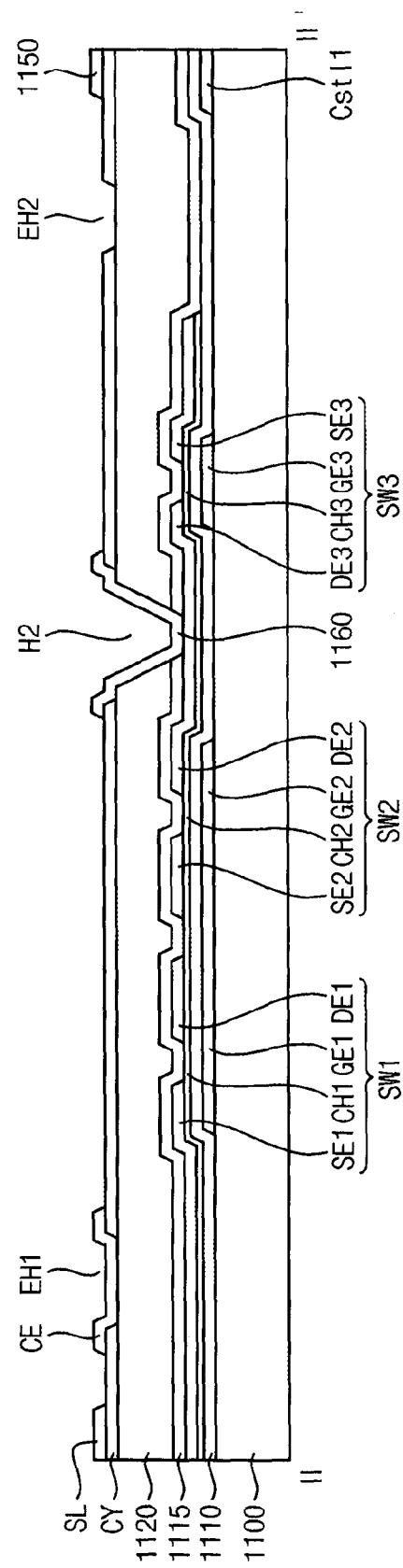
FIG. 17 is a cross-sectional view taken along a line II-II' of FIG. 16.

FIG. 17 is a cross-sectional view taken along a line II-II' of FIG. 16.

Referring to FIG. 17, a display substrate includes a base substrate 1100, a gate pattern, a first insulation layer 1110, a channel layer, a data pattern, a second insulation layer 1115, a color filter layer 1120, a capping layer CY, a high pixel electrode 1150, a low pixel electrode 1160 and cover electrode CE.

The first base substrate 1100 may include a material which has relatively high transmittance, thermal resistance, and chemical resistance. For example the first base substrate 1100 may include any one selected from the group consisting of glass, polyethylenenaphthalate, polyethylene terephthalate, polyacryl and a mixture thereof.

The gate pattern is disposed on the first base substrate 1100. The gate pattern includes a first high storage line Csth1, a second high storage line (refers to Csth2 of FIG. 15), a first low storage line CstL1, a second low storage line (refers to Cstl2 of FIG. 15), a gate line GL, a first gate electrode GE1, a second gate electrode GE2 and a third gate electrode GE3.

The gate pattern may include a metal, a metal alloy, a metal nitride, a conductive metal oxide, a transparent conductive material, and etc. For example, the gate pattern may include copper (Cu) which is opaque.

The first insulation layer 1110 is disposed on the gate pattern. The first insulation layer 1110 covers and insulates the first high storage line Csth1, the second high storage line Csth2, the first low storage line Cstl1, the second low storage line Cstl2, the gate line GL, the first gate electrode GE1, the second gate electrode GE2 and the third gate electrode GE3.

The channel layer is dispose on the first insulation layer 1110. The channel layer include a first channel portion CH1, a second channel portion CH2, and a third channel portion CH3. The first channel portion CH1 overlaps the first gate electrode GE1. The second channel portion CH2 overlaps the second gate electrode GE2. The third channel portion CH3 overlaps the third gate electrode GE3.

The data pattern is disposed on the channel layer. The data pattern includes a first drain electrode DE1, a first source electrode portion SE1, a second source electrode SE2, a second drain electrode DE2, a third source electrode SE3, a third drain electrode DE3, a first data line (refers to DL1 of FIG. 15) and a second data line (refers to DL2 of FIG. 15).

The data pattern may include a metal, a metal alloy, a metal nitride, a conductive metal oxide, a transparent conductive material, and etc. For example, the data pattern may include copper (Cu) which is opaque.

The first drain electrode DE1, the first source electrode SE1, the first channel portion CH1 and the first gate electrode GE1 form a first switching element SW1.

The second drain electrode DE2, the second source electrode SE2, the second channel portion CH2 and the second gate electrode GE2 form a second switching element SW2. The second source electrode SE2 is electrically connected to the first source electrode portion SE1.

The third drain electrode DE3, the third source electrode SE3, third channel portion CH3 and the third gate electrode GE3 form a third switching element SW3. The third drain electrode DE3 is electrically connected to the second drain electrode DE2.

The second insulation layer 1115 is disposed on the data pattern. The second insulation layer 1115 covers and insulates the first drain electrode DE1, the first source electrode portion SE1, the second source electrode SE2, the second drain electrode DE2, the third source electrode SE3, the third drain electrode DE3, the first data line (refers to DL1 of FIG. 15) and the second data line (refers to DL2 of FIG. 15).

The color filter layer 1120 is disposed on the second insulation layer 1115. The color filter layer 1120 supplies colors to the light passing through the liquid crystal layer. The color filter layer 1120 may include a red color filter layer, a green color filter layer and blue color filter layer. The color filter layer 1120 is formed on a region corresponds to a unit pixel. The color filter layers adjacent to each other in the first direction may have different colors. The color filter layer 1120 may overlap adjacent color filter layer in a boundary of the adjacent unit pixels. In addition, the color filter layer 1120 may be spaced apart from adjacent color filter layer in the boundary of the adjacent unit pixels.

A second contact hole H2 is formed through the second insulation layer 1115 and the color filter layer 1120, so that a portion of the second drain electrode DE2 (or the third drain electrode DE3) is exposed.

The capping layer CY is disposed on the color filter layer 1120. The capping layer CY covers the color filter layer 1120 to protect the color filter layer 1120 and prevent the color filter layer 1120 from being detached from the second insulation layer 1115. In addition, the capping layer CY may planarize an upper surface of the color filter layer 1120. For example, the capping layer CY may include silicon nitride or silicon oxide, and a refractive index of the capping layer CY may be about 1.7 to about 2.1.

The capping layer CY may have a first emission hole EH1 and a second emission hole EH2. A gas from the color filter layer 1120 may be emitted through the first emission hole EH1 and the second emission hole EH2. A gas may be emitted from the color filter layer 1120, so that portions in which the liquid crystal molecules are not filled up may be generated by the gas emitted from the color filter. However, in the present exemplary embodiment, a gas is removed through the first emission hole EH1 and the second emission hole EH2 formed on the capping layer CY before forming a liquid crystal layer. Thus, portions in which the liquid crystal molecules are not filled up may not be generated.

The cover electrode CE is disposed on the first emission hole EH1 and the second emission hole EH2. However, the cover electrode CE is not disposed on the second emission hole EH2. The cover electrode CE prevents the color filter layer 1120 from contacting the liquid crystal. The cover electrode CE may be bigger than the first emission hole EH1 in a plan view, thus, may completely cover the emission holes EH1 and EH2. The cover electrode CE, the high pixel electrode 1150 and the low pixel electrode 1160 may be formed from a same layer. The cover electrode CE may not be disposed on the second emission hole EH2.

The high pixel electrode 1150 is disposed on the capping layer CY. The high pixel electrode 1150 is electrically connected to the first drain electrode DE1 through the first contact hole (refers to H1 of FIG. 16).

The low pixel electrode 1160 is disposed on the capping layer CY. . The low pixel electrode 1160 is electrically connected to the second drain electrode DE2 (or the third drain electrode DE3) through the second contact hole H2. The cover electrode CE, the high pixel electrode 1150 and the low pixel electrode 1160 may be formed of a same layer.

The shielding line SL is overlapped with the first data line DL1 and the second data line DL2. The shielding line SL may extend in the second direction D2. The shielding line SL may be a transparent conductive pattern formed from a transparent conductive layer. The shielding line SL, the high pixel electrode 1150 and the low pixel electrode 1160 may formed from a same layer.

FIGS. 18 to 24 are cross-sectional views illustrating a method of manufacturing the display substrate of FIG. 17.

Figure 18:
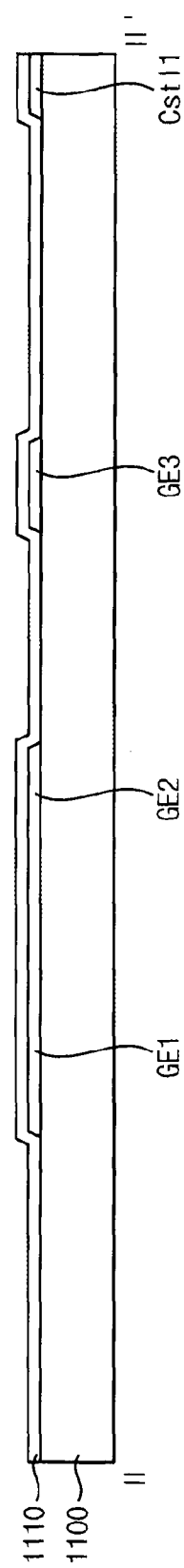
FIGS. 18 to 24 are cross-sectional views illustrating a method of manufacturing the display substrate of FIG. 17.

Referring to FIG. 18, a metal layer is formed on a first base substrate 1100, and then the metal layer may be partially etched by a photo-etching process using an additional etching mask. Hence, the gate pattern is formed. The gate pattern includes a first high storage line Csth1, a second high storage line (refers to Csth2 of FIG. 15), a first low storage line CstL1, a second low storage line (refers to Cstl2 of FIG. 15), a gate line GL, a first gate electrode GE1, a second gate electrode GE2 and a third gate electrode GE3.

The gate line GL extends in a first direction D1. The gate line GL is electrically connected to a first gate electrode GE1, the second gate electrode GE2 and the third gate electrode GE3.

The first high storage line Csth1 extends in the first direction D1, and is disposed adjacent to the gate line GL.

A first insulation layer 1110 is formed on the first base substrate 1100 on which the gate pattern is formed. The first insulation layer 1110 may be formed by a spin coating process, a printing process, a sputtering process, a CVD process, an ALD process, a PECVD process, an HDP-CVD process or a vacuum evaporation process in accordance with ingredients included in the first insulation layer 1110.

Figure 19:
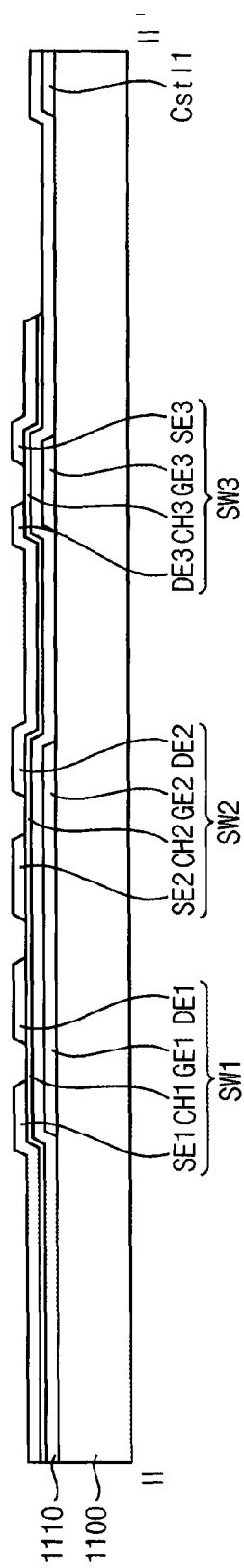

Referring to FIG. 19, a semiconductor layer and a metal layer are formed on the first insulation layer 1110, and then the semiconductor layer and the metal layer may be partially etched by a photo-etching process using an additional etching mask. Hence, the channel layer having first to third channel portions CH1, CH2 and CH3, and a data pattern are formed. The semiconductor layer may include a silicon semiconductor layer including amorphous silicon (a-Si:H) and an ohmic contact layer including n+ amorphous silicon (n+ a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The data pattern includes a first drain electrode DE1, a first source electrode portion SE1, a second source electrode SE2, a second drain electrode DE2, a third source electrode SE3, a third drain electrode DE3, a first data line DL1 and a second data line DL2. For example, the semiconductor later and the metal layer are formed at the same time. Hence, the first source electrode portion SE1 and the first drain electrode DE1, the second source electrode SE2 and the second drain electrode DE2, and the third source electrode SE3 and the third drain electrode DE3 are formed. Each of the source electrodes is spaced apart from the associated drain electrodes by a channel length The first drain electrode DE1, the first source electrode portion SE1, the first channel portion CH1 and the first gate electrode GE1 form a first switching element SW1.

The second drain electrode DE2, the second source electrode SE2, the second channel portion CH2 and the second gate electrode GE2 form a second switching element SW2. The second source electrode SE2 is electrically connected to the first source electrode portion SE1.

The third drain electrode DE3, the third source electrode SE3, third channel portion CH3 and the third gate electrode GE3 form a third switching element SW3. The third drain electrode DE3 is electrically connected to the second drain electrode DE2.

Figure 20:
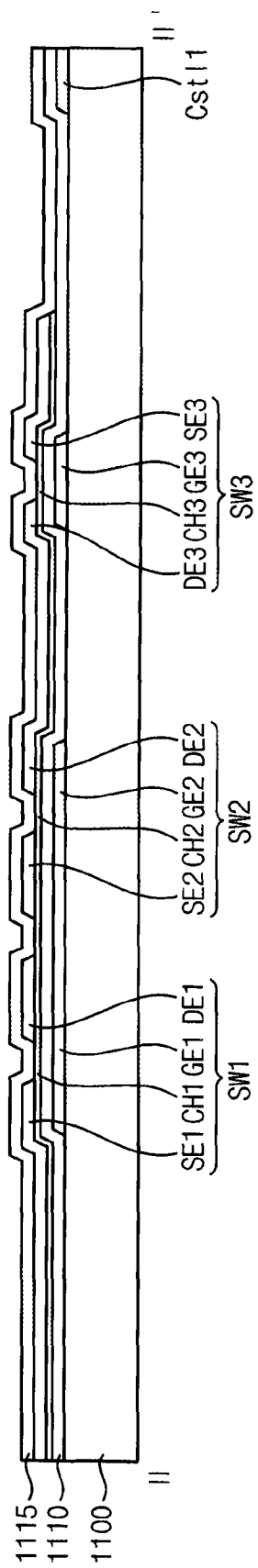

Referring to FIG. 20, a second insulation layer 1115 is formed on the first base substrate 1100 on which the data pattern is formed.

The second insulation layer 1115 may be formed by a spin coating process, a printing process, a sputtering process, a CVD process, an ALD process, a PECVD process, an HDP-CVD process or a vacuum evaporation process in accordance with ingredients included in the second insulation layer 1115. The second insulation layer 1115 is disposed on the data pattern. The second insulation layer 1115 covers and insulates the first drain electrode DE1, the first source electrode portion SE1, the second source electrode SE2, the second drain electrode DE2, the third source electrode SE3, the third drain electrode DE3, the first data line (refers to DL1 of FIG. 15) and the second data line (refers to DL2 of FIG. 15).

Figure 21:
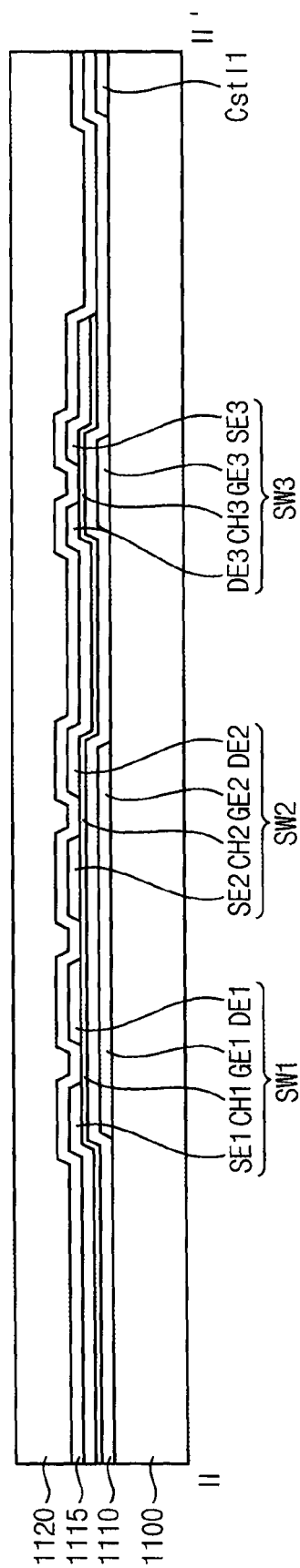

Referring to FIG. 21, a color filter layer 1120 is formed on the first base substrate 1100 on which the second insulation layer 1115 is formed. A color filter layer is formed on the second insulation layer 1115, and then the photoresist is exposed using a mask, and then the photoresist is developed using a developing solution. Hence, the color filter layer 1120 may be formed.

The color filter layer 1120 is disposed on the second insulation layer 1115. The color filter layer 1120 supplies colors to the light passing through the liquid crystal layer. The color filter layer 1120 may include a red color filter layer, a green color filter layer and blue color filter layer. The color filter layer 1120 is formed in a region corresponds to a unit pixel. The color filter layers adjacent to each other in a first direction may have different colors. The color filter layer 1120 may overlap adjacent color filter layer in a boundary of the adjacent unit pixels. In addition, the color filter layer 1120 may be spaced apart from adjacent color filter layer in the boundary of the adjacent unit pixels.

Figure 22:
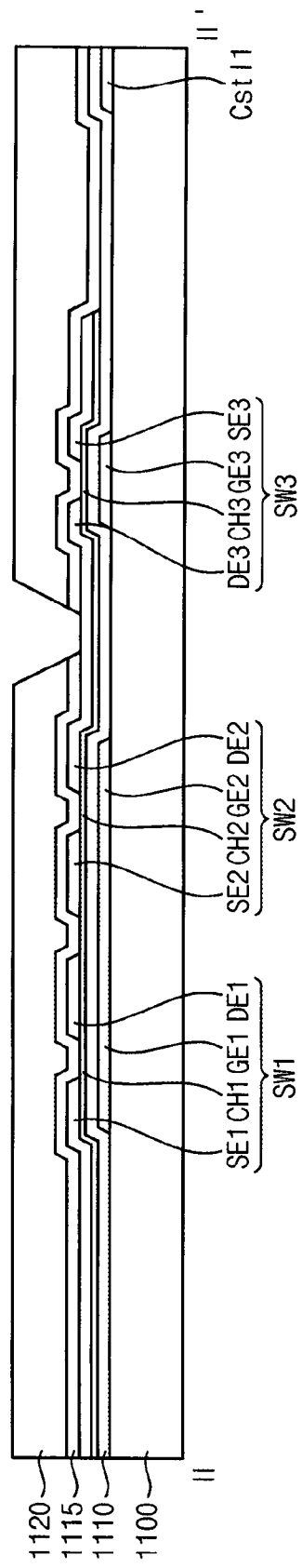

Referring to FIG. 22, contact holes including a second contact hole H2 is formed through the second insulation layer 1150 and the color filter layer 1120. The second contact hole H2 is formed through the second insulation layer 1150 and the color filter layer 1120, so that a portion of the drain electrodes including the second drain electrode DE2 (or the third drain electrode DE3) is exposed.

Figure 23:
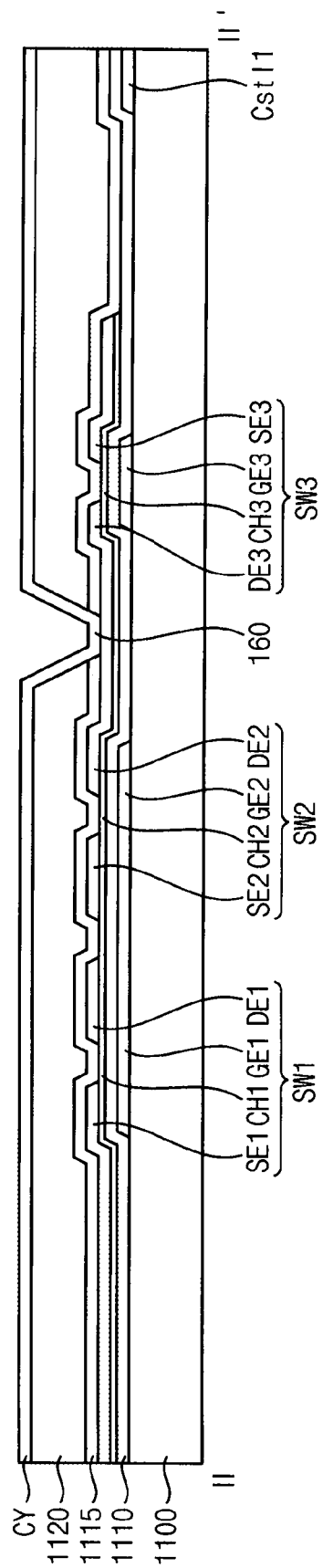

Referring to FIG. 23, a capping layer CY is disposed on the color filter layer 1120 on which the second contact hole H2 is formed.

The capping layer CY is disposed on the color filter layer 1120. The capping layer CY covers the color filter layer 1120 to protect the color filter layer 1120 and prevent the color filter layer 1120 from being detached. For example, the capping layer CY may include silicon nitride or silicon oxide, and a refractive index of the capping layer CY may be about 1.7 to about 2.1.

Figure 24:
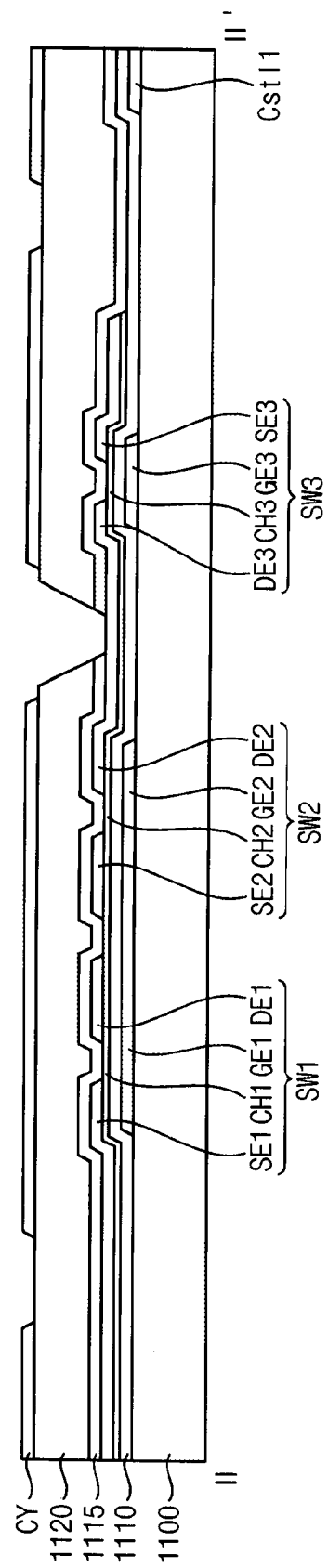

Referring to FIG. 24, the capping layer CY is patterned to form a first emission hole EH1 and a second emission hole EH2. The capping layer CY on the contact holes including the second contact hole H2 is removed at the same time The capping layer CY may have a first emission hole EH1 and a second emission hole EH2. A gas from the color filter layer 1120 may be removed through the first emission hole EH1 and the second emission hole EH2. A gas may be emitted from the color filter layer 1120, so that portions in which the liquid crystal molecules are not filled up may be generated. However, in the present exemplary embodiment, a gas is removed through the first emission hole EH1 and the second emission hole EH2 formed on the capping layer CY before filling with liquid crystal molecules. Thus, portions in which the liquid crystal molecules are not filled up may not be generated.

Referring to FIG. 17, a transparent conductive layer is formed on the capping layer CY, and then transparent conductive layer may be partially etched by a photo-etching process using an additional etching mask. Hence, a high pixel electrode 1150, a low pixel electrode 160 and a cover electrode CE may be formed. The transparent conductive layer may include indium tin oxide (ITO), indium zinc oxide (IZO) and etc.

The high pixel electrode 1150 is disposed adjacent to the gate line GL in the second direction D2, and between the first data line DL1 and the second data line DL2. The high pixel electrode 1150 is electrically connected to a first drain electrode DE1 of the first switching element SW1 through a first contact hole H1.

The low pixel electrode 1160 is disposed opposite to the high pixel electrode 1150 with reference to the gate line GL, and between the first data line DL1 and the second data line DL2. The low pixel electrode 1160 is electrically connected to the second drain electrode DE2 of the second switching element SW2 and the third drain electrode DE3 of the third switching element SW3 through a second contact hole H2. The high pixel electrode 1150, the low pixel electrode 1160 and the cover electrode CE may be formed of a same layer.

The cover electrode CE is disposed on the first emission hole EH1. The cover electrode CE prevents the color filter layer 1120 from contacting the liquid crystal. The cover electrode CE may be bigger than the first emission hole EH1 in a plan view. Thus, the cover electrode CE completely covers the first emission hole. The cover electrode CE, the high pixel electrode 1150 and the low pixel electrode 1160 may be formed of a same layer. The cover electrode CE may or may not be disposed on the second emission hole EH2.

Figure 25:
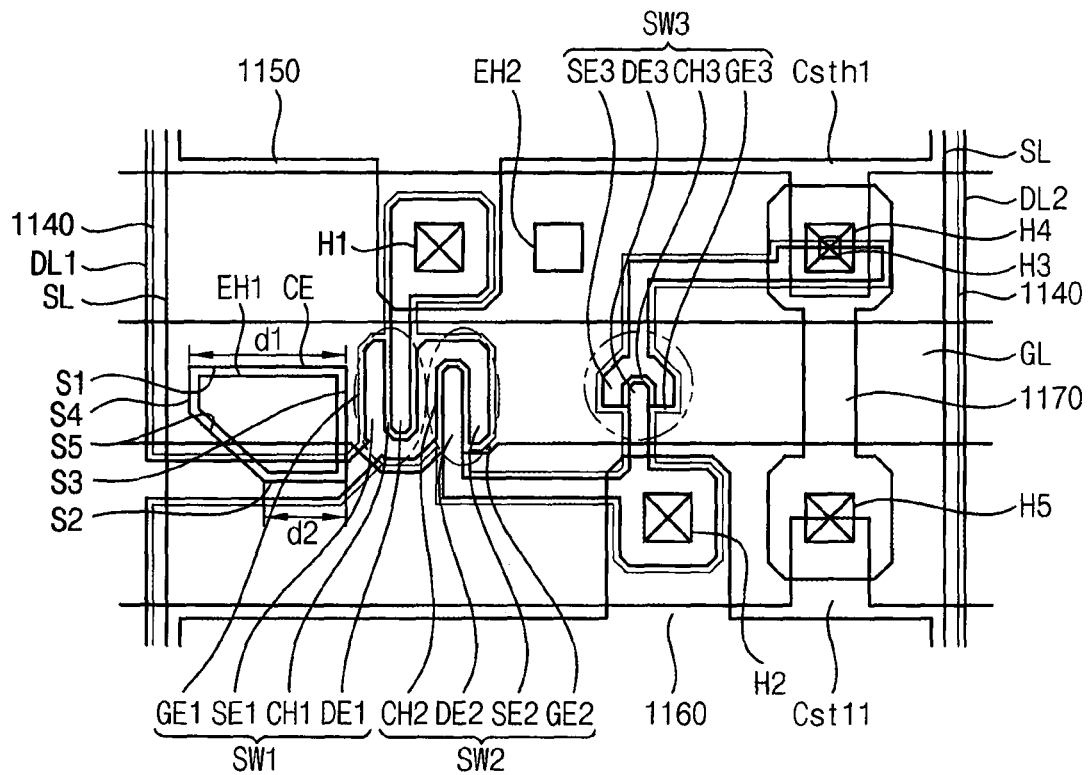
FIG. 25 is a partially enlarged view illustrating a switching element according to an exemplary embodiment of the inventive concept.

FIG. 25 is a partially enlarged view illustrating a switching element according to an exemplary embodiment of the inventive concept.

Referring to FIG. 25, a display panel includes a gate line GL, a first data line DL1, a second data line DL2, a shielding line SL, a first high storage line Csth1, a second high storage line (refers to Csth2 of FIG. 15), a first low storage line Cstl1, a second low storage line (refers to Cstl2 of FIG. 15), a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 1170 is electrically connected to the third source electrode SE3 of the third switching element SW3 and the first high storage line Csth1 through the third contact hole H3 and the fourth contact hole H4. In addition, the connecting electrode 1170 extends in the second direction D2, and electrically connected to the first low storage line Cstl1 through the fifth contact hole H5.

The shielding line SL is overlapped with the first data line DL1 and the second data line DL2. The shielding line SL may extend in the second direction D2. The shielding line SL may be a transparent conductive pattern formed from a transparent conductive layer. The shielding line SL, the high pixel electrode 1150 and the low pixel electrode 1160 may formed from a same layer.

The first emission hole EH1 and the cover electrode CE partially overlaps the gate line GL and the first switching element SW1. The cover electrode CE may overlap the gate line GL by a first width d1. The cover electrode CE may overlap the first source electrode extension portion of the first switching element SW1 by a second width d2. The second width d2 may be smaller than the first width d1. The cover electrode CE may include a first side S1 extending in a first direction D1 and a second side S2 extending in the first direction D1, opposing the first side S1 and shorter than the first side S1, a third side S3 extending in the second direction D2, a fourth side S4 extending in the second side, opposing the third side S3 and shorter than the third side S3 and a fifth side S5 connecting the second side S2 and the fourth side S4. The first side S1 may overlap the gate line GL. A side extending in the first direction D1 of the first emission hole EH1 may be longer than a side extending in the second direction D2 of the first emission hole EH1. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first switching element SW1 by a second width d2. The second width d2 may be smaller than the first width d1. The first source electrode extension portion of the first switching element SW1 not overlapping the cover electrode CE may be cut in a repair process. When a portion of the first source electrode portion SE1 of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the first emission hole EH1 is relatively wide. Thus, enough margins for laser repair are secured and success rate of repair may be increased.

Figure 26:
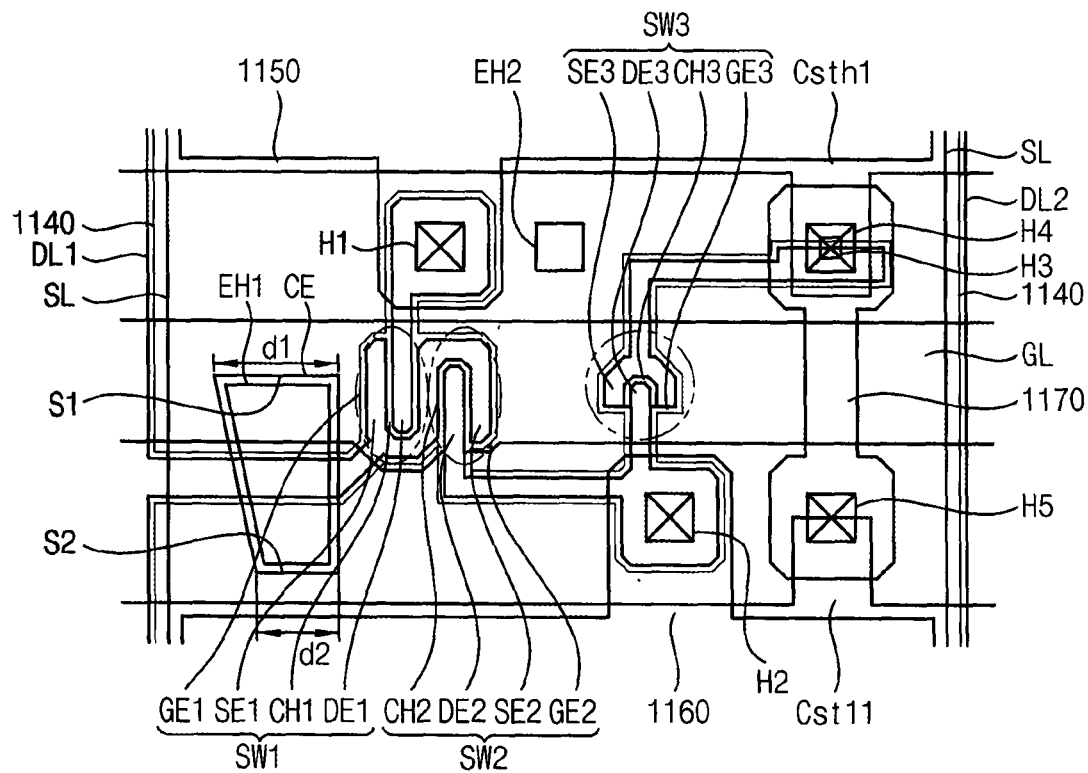
FIG. 26 is a partially enlarged view illustrating a switching element according to an exemplary embodiment of the inventive concept.

FIG. 26 is a partially enlarged view illustrating a switching element according to an exemplary embodiment of the inventive concept.

Referring to FIG. 26, a display panel includes a gate line GL, a first data line DL1, a second data line DL2, a shielding line SL, a first high storage line Csth1, a second high storage line (refers to Csth2 of FIG. 15), a first low storage line Cstl1, a second low storage line (refers to Cstl2 of FIG. 15), a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H) a. In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H). In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 1170 is electrically connected to the third source electrode SE3 of the third switching element SW3 and the first high storage line Csth1 through the third contact hole H3 and the fourth contact hole H4. In addition, the connecting electrode 1170 extends in the second direction D2, and electrically connected to the first low storage line Cstl1 through the fifth contact hole H5.

The shielding line SL is overlapped with the first data line DL1 and the second data line DL2. The shielding line SL may extend in the second direction D2. The shielding line SL may be a transparent conductive pattern formed from a transparent conductive layer. The shielding line SL, the high pixel electrode 1150 and the low pixel electrode 1160 may formed from a same layer.

The first emission hole EH1 and the cover electrode CE partially overlap the gate line GL and the first switching element SW1. The cover electrode CE may overlap the gate line GL by a first width d1. The cover electrode CE may overlap the source electrode portion SE1 the first switching element SW1 by a second width d2. The second width d2 may be smaller than the first width d1. The first emission hole EH1 may include a first side S1 extending in a first direction D1 and a second side S2 extending in the first direction and opposing the first side S1. The second side S2 may be shorter than the first side S1. For example, the first emission hole EH1 may be formed as a trapezoid shape. The first side S1 may overlap the gate line GL. A side extending in the first direction D1 of the first emission hole EH1 may be longer than a side extending in the second direction D2 of the first emission hole EH1. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first switching element SW1 by a second width d2. The second width d2 may be smaller than the first width d1. The first source electrode extension portion of the first switching element SW1 not overlapping the first cover electrode CE may be cut in a repair process. When a portion of the first source electrode portion SE1 of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the first emission hole EH1 is relatively wide. Thus, enough margins for laser repair are secured and success rate of repair may be increased.

Figure 27:
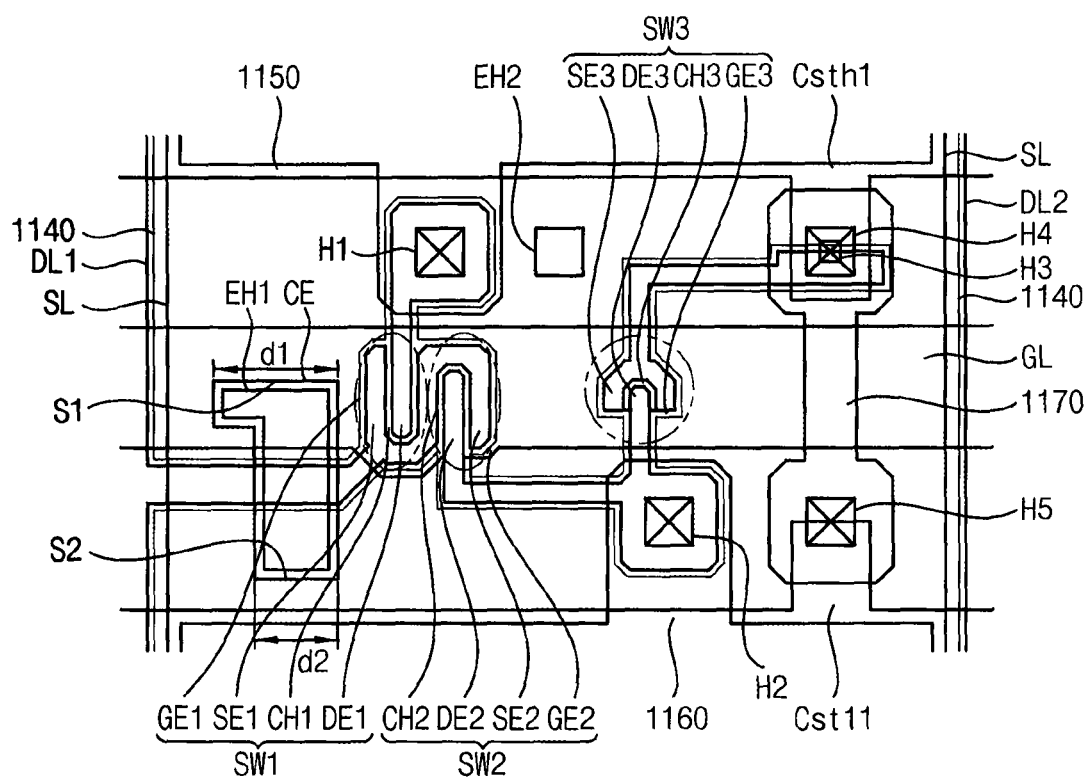
FIG. 27 is a partially enlarged view illustrating a switching element according to an exemplary embodiment of the inventive concept.

FIG. 27 is a partially enlarged view illustrating a switching element according to an exemplary embodiment of the inventive concept.

Referring to FIG. 14, a display panel includes a gate line GL, a first data line DL1, a second data line DL2, a shielding line SL, a first high storage line Csth1, a second high storage line (refers to Csth2 of FIG. 15), a first low storage line Cstl1, a second low storage line (refers to Cstl2 of FIG. 15), a first switching element SW1, a second switching element SW2, a third switching element SW3, a channel layer 140, a high pixel electrode 150, a low pixel electrode 160, a connecting electrode 170, a first emission hole EH1, a second emission hole EH2 and a cover electrode CE.

The first switching element SW1 includes the first gate electrode GE1, the first source electrode portion SE1, the first drain electrode DE1 and a first channel portion CH1 connecting the first source electrode portion SE1 to the first drain electrode DE1.

The first channel portion CH1 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The second switching element SW2 includes the second gate electrode GE2, the second source electrode SE2, the second drain electrode DE2 and a second channel portion CH2 connecting the second source electrode SE2 to the second drain electrode DE2.

The second channel portion CH2 may include a semiconductor layer including amorphous silicon (a-Si:H). In addition, the first channel portion CH1 may include an oxide semiconductor. The oxide semiconductor may include an amorphous oxide including at least one selected from the group consisting of indium (In), zinc (Zn), gallium (Ga), tin (Sn) and hafnium (Hf).

The third switching element SW3 includes the third gate electrode GE3, the third source electrode SE3, the third drain electrode DE3 and a third channel portion CH3 connecting the third source electrode SE3 to the third drain electrode DE3.

The third channel portion CH3 may include a semiconductor layer including amorphous silicon (a-Si:H) an. In addition, the third channel portion CH3 may include an oxide semiconductor. The oxide semiconductor may include an amorphous oxide including at least one selected from the group consisting of indium (In), zinc (Zn), gallium (Ga), tin (Sn) and hafnium (Hf).

The connecting electrode 1170 is electrically connected to the third source electrode SE3 of the third switching element SW3 and the first high storage line Csth1 through the third contact hole H3 and the fourth contact hole H4. In addition, the connecting electrode 1170 extends in the second direction D2, and electrically connected to the first low storage line Cstl1 through the fifth contact hole H5.

The shielding line SL is overlapped with the first data line DL1 and the second data line DL2. The shielding line SL may extend in the second direction D2. The shielding line SL may be a transparent conductive pattern formed from a transparent conductive layer. The shielding line SL, the high pixel electrode 1150 and the low pixel electrode 1160 may formed from a same layer.

The first emission hole EH1 and the cover electrode CE partially overlap the gate line GL and the first switching element SW1. The cover electrode CE may overlap the gate line GL by a first width d1. The cover electrode CE may overlap the first source electrode extension portion of the first switching element SW1 by a second width d2. The second width d2 may be smaller than the first width d1. The cover electrode CE may include a first side S1 extending in a first direction D1 and a second side S2 extending in the first direction and opposing the first side S1. The second side S2 may be shorter than the first side S1. For example, the first emission hole and the cover electrode CE EH1 may be formed as an "L" shape. The first side S1 may overlap the gate line GL. A side extending in the second direction D2 of the first emission hole EH1 may be longer than a side extending in the first direction D1 of the first emission hole EH1. The first emission hole EH1 may be completely covered by the cover electrode CE. The first emission hole EH1 and the cover electrode CE may have the same configuration. The cover electrode CE may be bigger than the first emission hole EH1 in a plan view.

The second emission hole EH2 may be smaller than the first emission hole EH1. The second emission hole EH2 may not overlap the gate line GL and the first switching element SW1. The second emission hole EH2 may not be covered by the cover electrode CE.

According to the present exemplary embodiment, the cover electrode CE may overlap the gate line GL by a first width d1. The cover electrode CE may overlap the first source electrode extension portion of the first switching element SW1 by a second width d2. The second width d2 may be smaller than the first width d1. The first source electrode extension portion of the first switching element SW1 not overlapped with the first emission hole EH1 may be cut in a repair process. When a portion of the first source electrode portion SE1 of the first switching element SW1 overlapping the cover electrode CE is cut, short circuit between the first source electrode portion SE1 and the cover electrode CE may be occurred. Accordingly, success rate of repair may be decreased. However, in the present exemplary embodiment, the first source electrode extension portion of the first switching element SW1 not overlapping the first emission hole EH1 is relatively wide. Thus, enough margins for laser repair are secured and success rate of repair may be increased.

According to the present inventive concept as explained above, a portion of the source electrode of the switching element not overlapping the emission hole is relatively wide. Thus, enough margins for laser repair is secured and success rate of repair may be increased.

In addition, success rate of repair is increased, so that failure of the display apparatus may be decreased. Thus, quality of the display apparatus may be improved.

The foregoing embodiments are illustrative of the inventive concept and are not to be construed as limiting the scope of the inventive concept. Although a few exemplary embodiments of the inventive concept have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The present inventive concept is defined by the following claims, with equivalents of the claims to be included therein.

What is claimed is:

1. A display substrate comprising:
   a first switching element electrically connected to a gate line extending in a first direction, a data line extending in a second direction crossing the first direction and a pixel electrode disposed adjacent to the data line;
   an organic layer disposed on the first switching element;
   a capping layer disposed on the organic layer, the capping layer having a first emission hole;
   a cover electrode covering the first emission hole, the cover electrode overlapping the gate line by a first width and overlapping the first switching element by a second width smaller than the first width.

2. The display substrate of claim 1,
   wherein the first switching element is a source electrode extension portion connecting a source electrode to the data line, and
   wherein the cover electrode comprises:
   a first side extending in the first direction; and
   a second side opposing the first side and extending in the first direction, wherein the second side is shorter than the first side,
   wherein the cover electrode has an "L" shape.

3. The display substrate of claim 1,
   wherein the first switching element is a source electrode extension portion connecting a source electrode to the data line, and
   wherein the cover electrode comprises:
   a first side extending in the first direction; and
   a second side opposing the first side and extending in the first direction, wherein the second side is shorter than the first side,
   wherein the cover electrode has a trapezoid shape.

4. The display substrate of claim 1,
   wherein the first switching element is a source electrode extension portion connecting a source electrode to the data line, and
   wherein the cover electrode comprises:
   a first side extending in the first direction; and
   a second side opposing the first side and extending in the first direction, wherein the second side is shorter than the first side;
   a third side extending in the second direction;
   a fourth side opposing the third side and extending in the second direction, wherein the fourth side is shorter than the third side; and
   a fifth side connecting the second side and the fourth side,
   wherein the first side overlaps the gate line and the second side overlaps the source electrode extension portion.

5. The display substrate of claim 1, further comprising:
   a shielding line spaced apart from the pixel electrode to overlap the data line, and
   wherein the organic layer is a color filter.

6. The display substrate of claim 1, wherein the cover electrode and the pixel electrode are formed from a same layer.

7. The display substrate of claim 1, further comprising:
   a second switching element electrically connected to the gate line, the data line and a low pixel electrode being spaced apart from the pixel electrode; and
   a third switching element electrically connected to the gate line and the second switching element,
   wherein the capping layer has a second emission hole smaller than the first emission hole.

8. The display substrate of claim 7, further comprising:
   a high storage line overlapped with the pixel electrode; and
   a low storage line overlapped with the low pixel electrode.

9. The display substrate of claim 8, wherein the third switching element is electrically connected with the high storage line.

10. The display substrate of claim 1, wherein the high storage line comprises a first high storage line extending in the first direction and a second high storage line extending in the second direction, and
    wherein the low storage line comprises a first low storage line extending in the first direction and a second low storage line extending in the second direction.

* * * * *